United States Patent
Qi et al.

(10) Patent No.: US 11,447,858 B2
(45) Date of Patent: Sep. 20, 2022

(54) SYSTEM AND METHOD FOR FABRICATING PEROVSKITE FILM FOR SOLAR CELL APPLICATIONS

(71) Applicant: OKINAWA INSTITUTE OF SCIENCE AND TECHNOLOGY SCHOOL CORPORATION, Okinawa (JP)

(72) Inventors: Yabing Qi, Okinawa (JP); Luis Katsuya Ono, Okinawa (JP); Shenghao Wang, Okinawa (JP)

(73) Assignee: OKINAWA INSTITUTE OF SCIENCE AND TECHNOLOGY SCHOOL CORPORATION, Okinawa (JP)

( * ) Notice: Subject to any disclaimer, the term of this patent is extended or adjusted under 35 U.S.C. 154(b) by 943 days.

(21) Appl. No.: 16/230,095

(22) Filed: Dec. 21, 2018

(65) Prior Publication Data

US 2019/0218657 A1    Jul. 18, 2019

Related U.S. Application Data

(62) Division of application No. 15/308,822, filed as application No. PCT/JP2015/002041 on Apr. 10, 2015, now abandoned.
(Continued)

(51) Int. Cl.
*C23C 14/24*  (2006.01)
*C23C 14/06*  (2006.01)
(Continued)

(52) U.S. Cl.
CPC ............ *C23C 14/24* (2013.01); *C23C 14/06* (2013.01); *C23C 14/0694* (2013.01);
(Continued)

(58) Field of Classification Search
CPC ..... C23C 14/24; C23C 14/06; C23C 14/0694; C23C 14/545; C23C 14/548;
(Continued)

(56) References Cited

U.S. PATENT DOCUMENTS 4,748,313 A    5/1988  de Rudnay
4,855,013 A    8/1989  Ohta et al.
(Continued)

FOREIGN PATENT DOCUMENTS

CN    101280418 A    10/2008
CN    101962750 A    2/2011
(Continued)

OTHER PUBLICATIONS

Liu et al. (Efficient planar heterojunction perovskite solar cells by vapor deposition, Nature, 501, 395-398, 2013) (Year: 2013).*
(Continued)

*Primary Examiner* — Francisco W Tschen
(74) *Attorney, Agent, or Firm* — WHDA, LLP

(57) ABSTRACT

A system and method for fabricating perovskite films for solar cell applications are provided, the system including a housing for use as a vacuum chamber, a substrate stage coupled to the top section of the housing; a first evaporator unit coupled to the bottom section of the housing and configured to generate $BX_2$ (metal halide material) vapor; a second evaporator unit coupled to the housing and configured to generate AX (organic material) vapor; and a flow control unit coupled to the housing for controlling circulation of the AX vapor. The dimensions of the horizontal cross-sectional shape of the first evaporator unit, the dimensions of the horizontal cross-sectional shape of the substrate stage, and the relative position in the horizontal direction
(Continued)

between the two horizontal cross-sectional shapes are configured to maximize the overlap between the two horizontal cross-sectional shapes.

8 Claims, 18 Drawing Sheets

Related U.S. Application Data

(60) Provisional application No. 61/988,547, filed on May 5, 2014.

(51) Int. Cl.
  *C23C 14/54* (2006.01)
  *H01L 51/00* (2006.01)
  *H01L 51/44* (2006.01)
  *H01L 51/42* (2006.01)

(52) U.S. Cl.
  CPC .......... *C23C 14/545* (2013.01); *C23C 14/548* (2013.01); *H01L 51/001* (2013.01); *H01L 51/0012* (2013.01); *H01L 51/44* (2013.01); *H01L 51/42* (2013.01); *Y02E 10/549* (2013.01)

(58) Field of Classification Search
  CPC ... C23C 14/0021; C23C 14/243; C23C 14/50; C23C 14/52; C23C 14/541; C23C 14/542; C23C 14/566; C23C 16/45589; H01L 51/001; H01L 51/0012; H01L 51/44; H01L 51/42; Y02E 10/549
  See application file for complete search history.

(56) References Cited

U.S. PATENT DOCUMENTS

| | | | |
|---|---|---|---|
| 5,556,472 A * | 9/1996 | Nakamura | C30B 29/22 204/298.25 |
| 5,648,114 A | 7/1997 | Paz De Araujo et al. | |
| 6,364,956 B1 | 4/2002 | Wang et al. | |
| 2001/0013311 A1* | 8/2001 | Migita | H01L 39/2458 117/1 |
| 2002/0017245 A1 | 2/2002 | Tsubaki et al. | |
| 2002/0108572 A1 | 8/2002 | Yamazaki et al. | |
| 2002/0179013 A1 | 12/2002 | Kido et al. | |
| 2003/0075107 A1 | 4/2003 | Miyano et al. | |
| 2004/0000379 A1 | 1/2004 | Slyke et al. | |
| 2005/0120959 A1 | 6/2005 | Isoda et al. | |
| 2008/0138517 A1 | 6/2008 | Ahn et al. | |
| 2008/0272463 A1 | 11/2008 | Butcher et al. | |
| 2008/0274616 A1* | 11/2008 | Hasegawa | C23C 16/34 257/E21.476 |
| 2010/0159132 A1 | 6/2010 | Conroy et al. | |
| 2011/0101245 A1* | 5/2011 | Hu | H01J 37/1472 118/726 |
| 2015/0249170 A1* | 9/2015 | Snaith | H01L 31/035272 136/265 |
| 2016/0380136 A1 | 12/2016 | Ning et al. | |

FOREIGN PATENT DOCUMENTS

| | | |
|---|---|---|
| FR | 1365706 A | 7/1964 |
| JP | 6-223970 A | 8/1994 |
| JP | 2005-126821 A | 5/2005 |
| WO | 2004/077581 A1 | 9/2004 |
| WO | 2014/045021 A1 | 3/2014 |

OTHER PUBLICATIONS

Unger et al. (Chloride in Lead Chloride-Derived Organo-Metal Halides for Perovskite-Absorber Solar Cells, Chem. Mater., 2014, 26, 7158-7165; Unger) (Year: 2014).*
Communication pursuant to Article 94(3) EPC dated Nov. 15, 2019, issued in counterpart EP Application No. 15 789 207.6 (4 pages).
First Examination Report dated Mar. 13, 2019, issued in counterpart IN Application No. 201617037519, with English translation. (6 pages).
Office Action dated Nov. 16, 2018, issued in counterpart Chinese Application No. 201580023234.0, with English translation. (7 pages).
Colella, S. et al., "MAPbl3-xClx Mixed Halide Perovskite for Hybrid Solar Cells: The Role of Chloride as Dopant on the Transport and Structural Properties", Chemistry of Materials, Oct. 21, 2013, vol. 25, pp. 4613-4618 cited in Japanese Notification of Reasons for Refusal dated Jun. 12, 2018.
First Notification of Office Action dated May 3, 2018, issued in counterpart Chinese Application No. 201580023234.0, with English translation.
Notification of Reasons for Refusal dated Jun. 12, 2018, issued in counterpart Japanese Application No. 2016-565516, with English machine translation.
Non-Final Office Action dated Nov. 16, 2017, issued in U.S. Appl. No. 15/308,822.
Final Office Action dated Jun. 6, 2018, issued in U.S. Appl. No. 15/308,822.
Non-Final Office Action dated Sep. 24, 2018, issued in U.S. Appl. No. 15/308,822.
European Search Report dated Dec. 8, 2017, in a counterpart European patent application No. 15789207.6.
Masanao Era et al., "Self-Organized Growth of Pbl-Based Layered Perovskite Quantum Well by Dual-Source Vapor Deposition", Chemistry of Materials, vol. 9, No. 1, Jan. 1, 1997 (Jan. 1, 1997), pp. 8-10 (Cited in the European Search Report).
David J. Lewis et al., "Ambient pressure aerosol-assisted chemical vapour deposition of (CH3NH3)PbBr3, an horganic-organic perovskite important in photovoltaics", Chemical Communications, vol. 50, No. 48, May 1, 2014 (May 1, 2014), pp. 6319-6321 (Cited in the European Search Report).
Julian Burschka et al., Sequential deposition as a route to high-performance perovskite-sensitized solar cells. Nature, Jul. 18, 2013, vol. 499, 316-320 (Mentioned in paragraph No. 5 of the as-filed specification).
Mingzhen Liu et al., Efficient planar heterojunction perovskile solar cells by vapour deposition. Nature, Sep. 19, 2013, vol. 501, pp. 395-398 (Cited in the ISR and mentioned in paragraph No. 5 of the as-filed specification).
Dianyi Liu et al., Perovskile solar cells with a planar heterojunclion structure prepared using room-temperature solution processing techniques. Nature Pholonics, vol. 8, 1-6 (2013) (Mentioned in paragraph No. 5 of the as-filed specification).
Olga Malinkiewicz et al., Perovski e solar cells employing organic charge-transport layers. Nature Pholonics, vol. 8 128-132 (2014) (Mentioned in paragraph No. 5 of the as-filed specification).
Nam-Gyu Park, Organomelal Perovski e Light Absorbers Toward a 20% Efficiency Low-Cost Solid-Slate Mesoscopic Solar Cell. J Phys. Chem. Lett. 2423-2429 (2013) (Mentioned in paragraph No. 5 of the as-filed specification).
International Search Report (ISR) issued in PCT/JP2015/002041 dated Jul. 2015.
Written Opinion (PCT/ISA/237) issued in PCT/JP2015/002041 dated Jul. 2015.
Q. Chen et al., "Planar Heterojunclion Perovskite Solar Cells via Vapor-Assisted Solution Process", Journal of He American Chemical Society, Dec. 20, 2013, vol. 136, pp. 622-625 (Cited in the ISR).
L. K. Ono et al., "Fabrication of semi-transparent perovski e films with centimeter-scale supperior uniformity by the hybrid deposition method", ENERGY & Enviromental Science, Dec. 2014, vol. 7, No. 12, pp. 3989-3993 (Cited in the ISR).

* cited by examiner

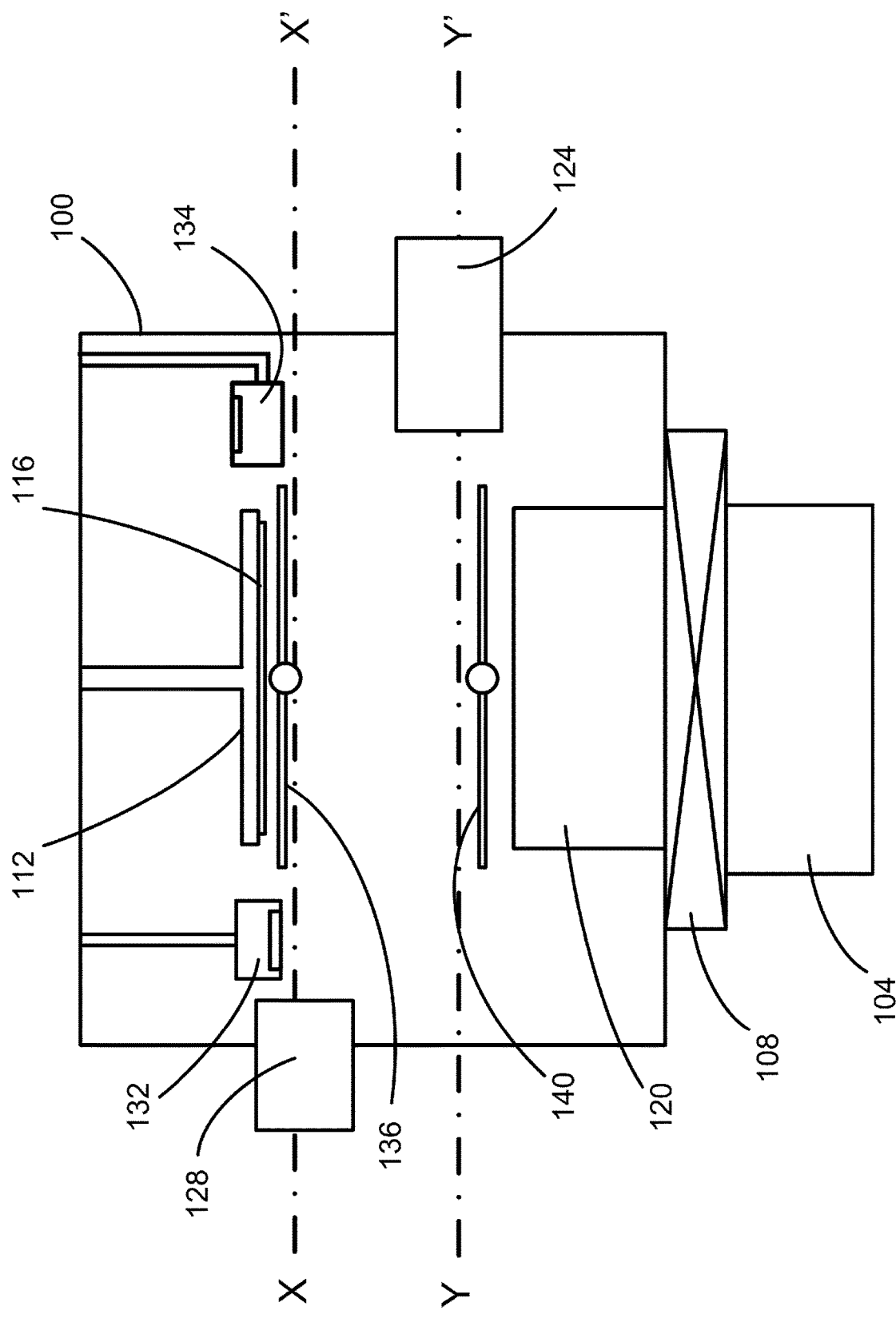

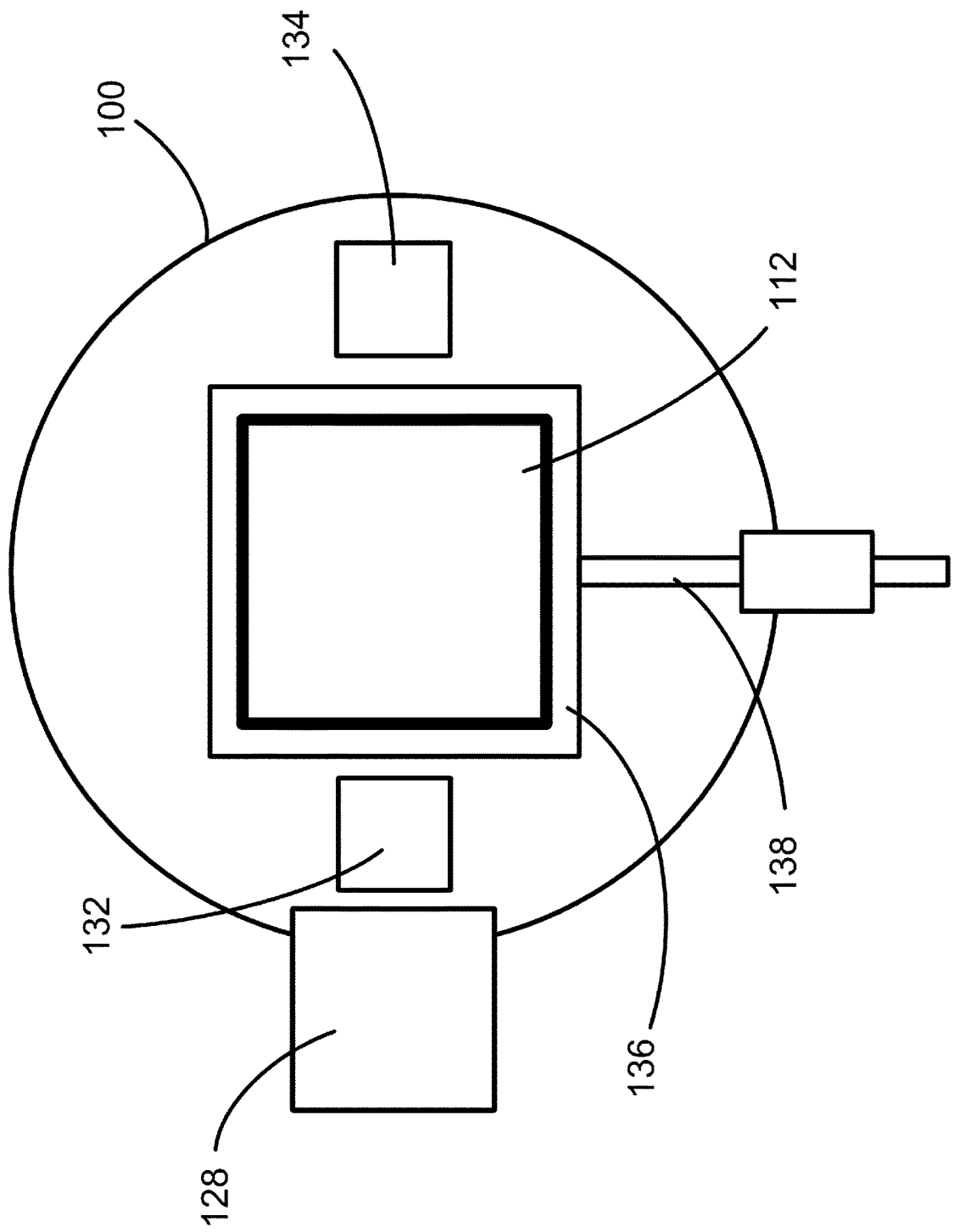
[Fig. 2]

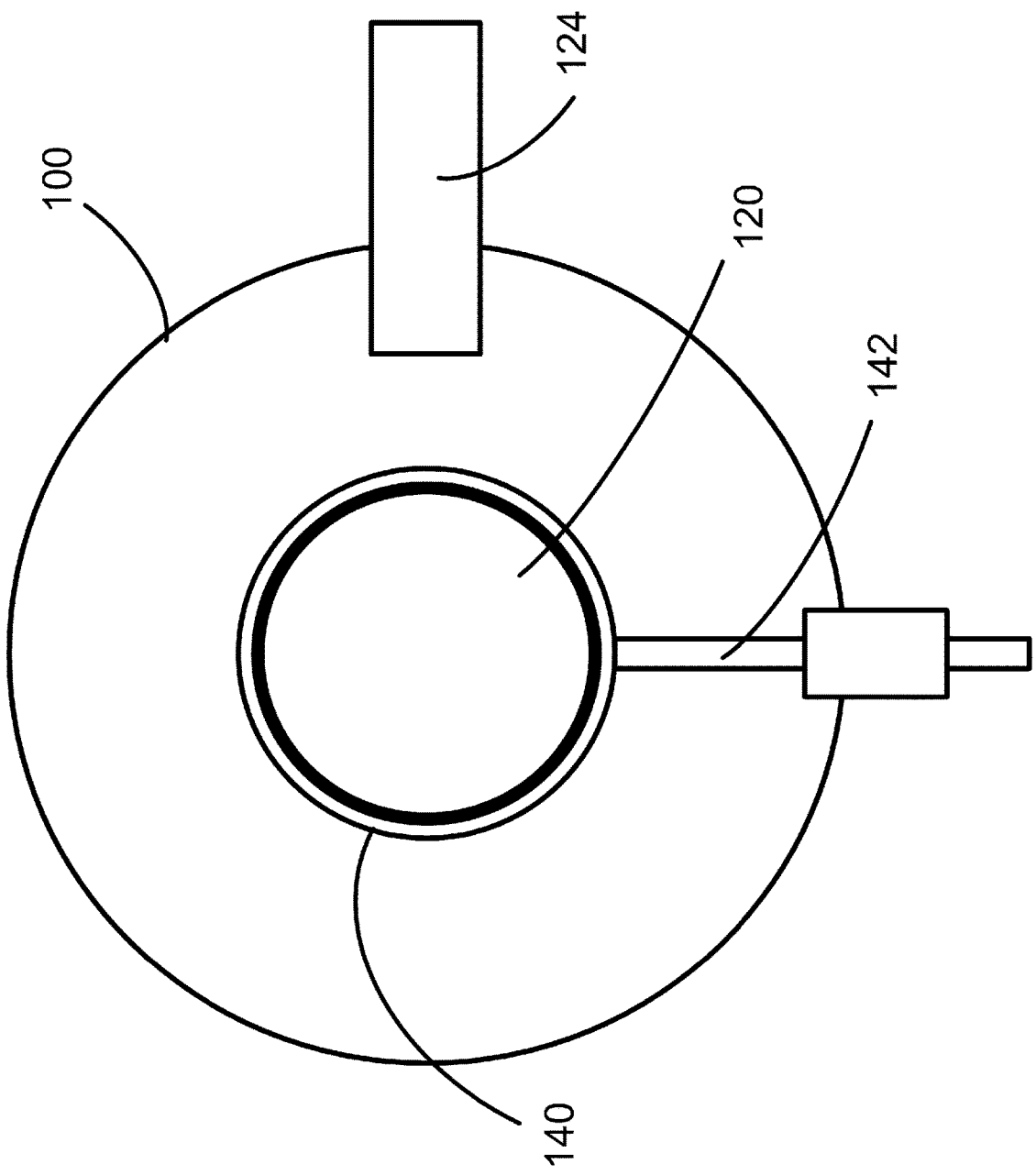
[Fig. 3]

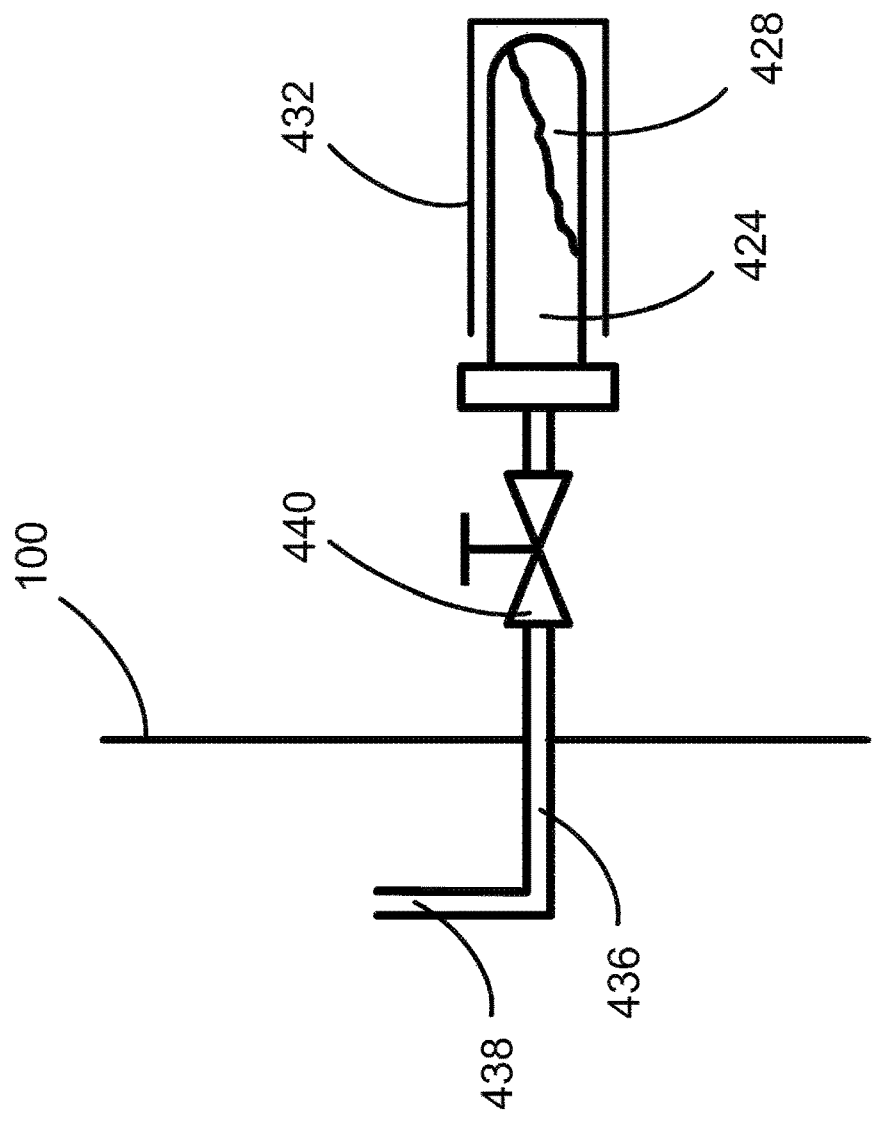
[Fig. 4B]
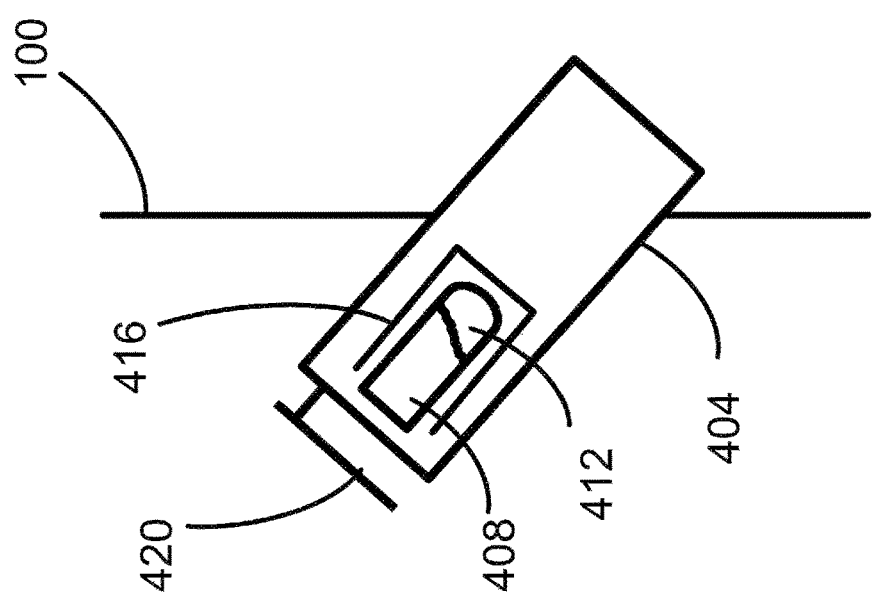
[Fig. 4A]

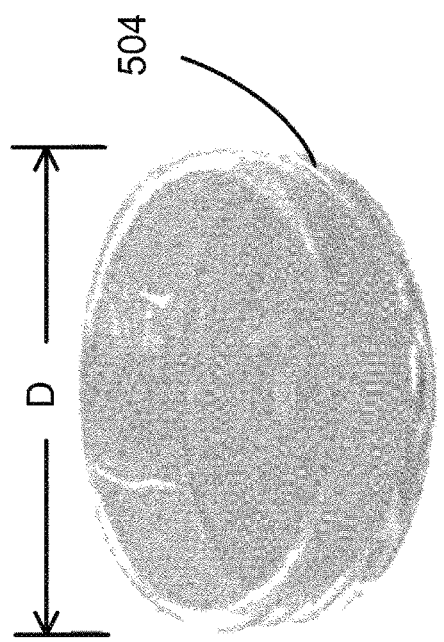
[Fig. 5B]
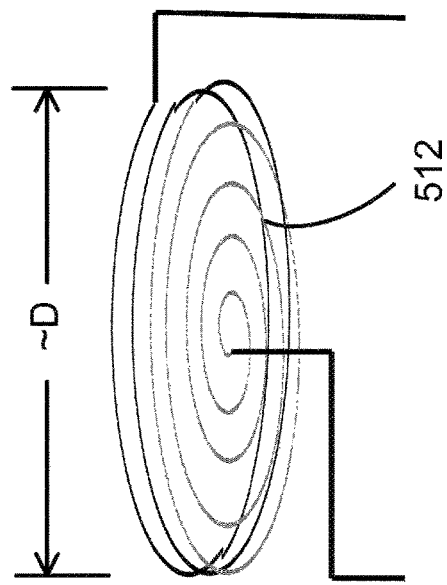
[Fig. 5C]
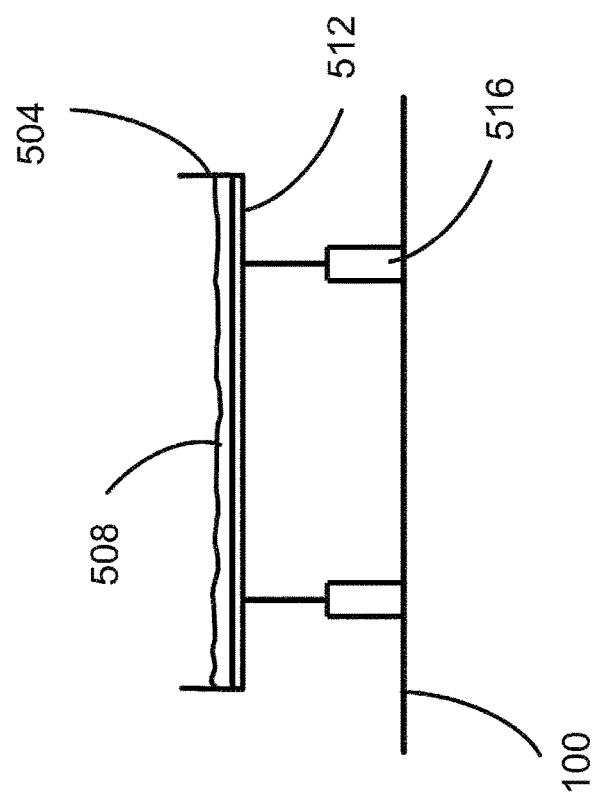
[Fig. 5A]

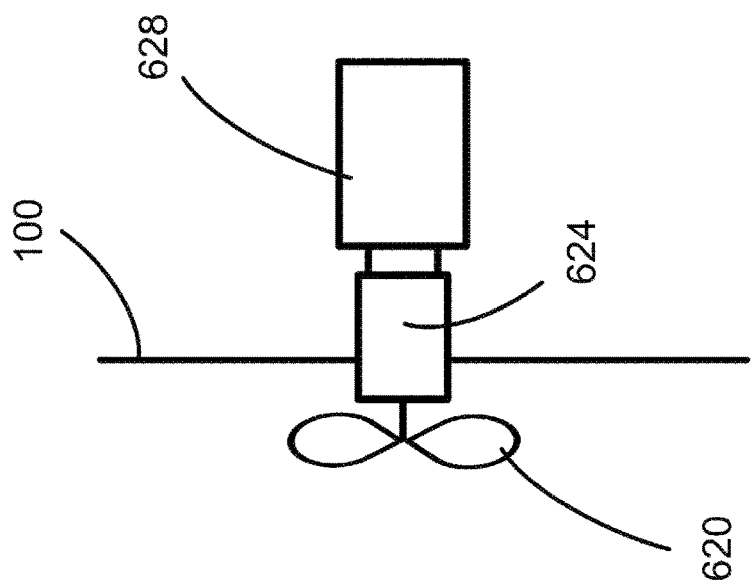
[Fig. 6B]
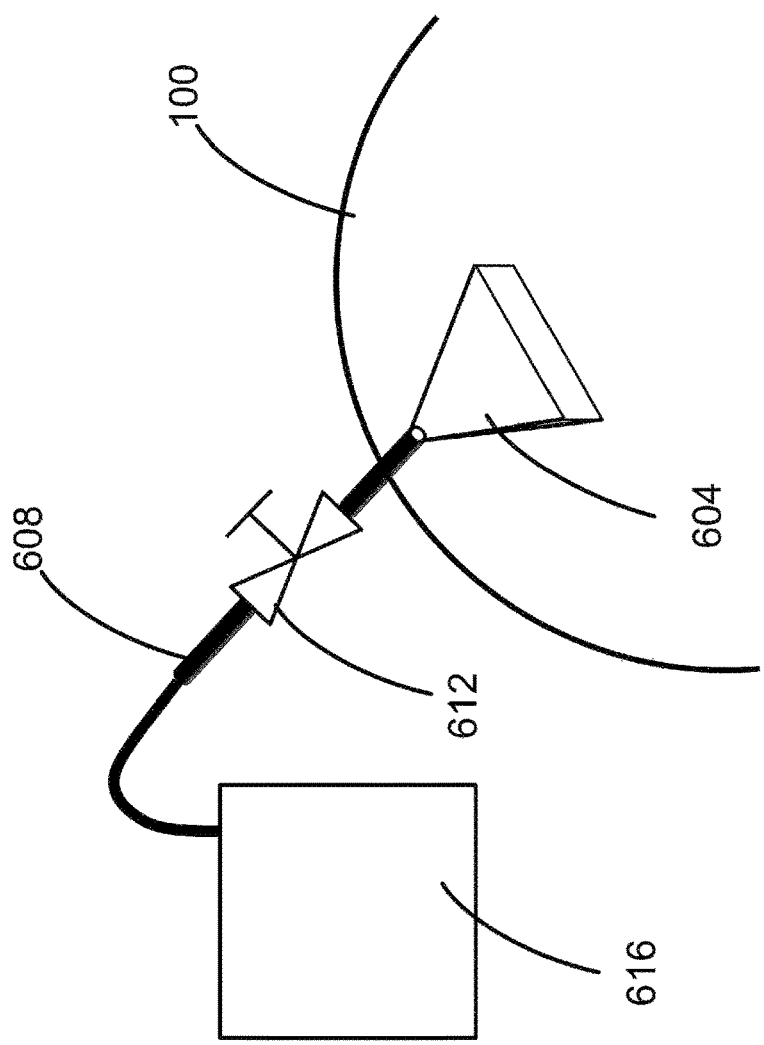
[Fig. 6A]

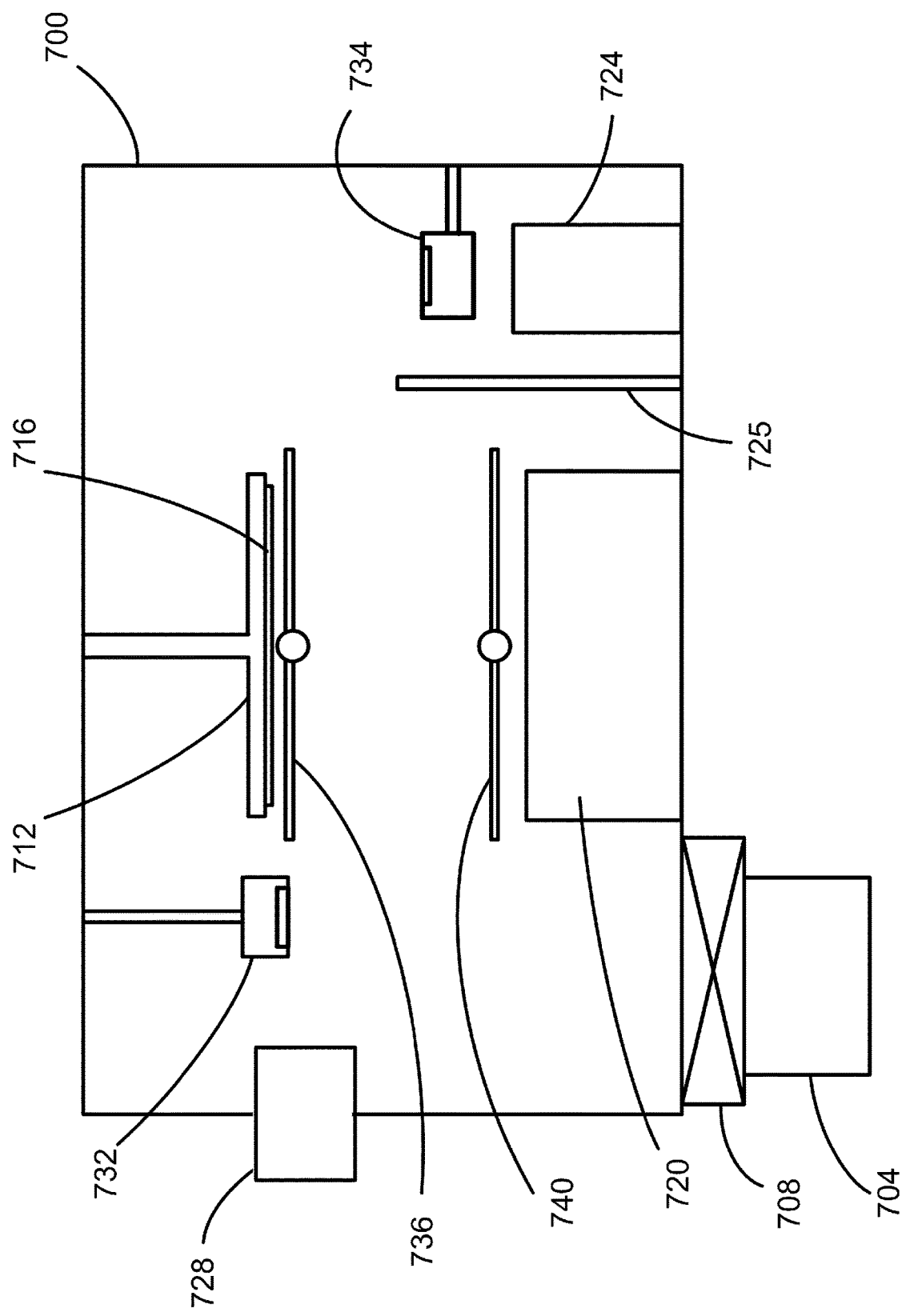
[Fig. 7]

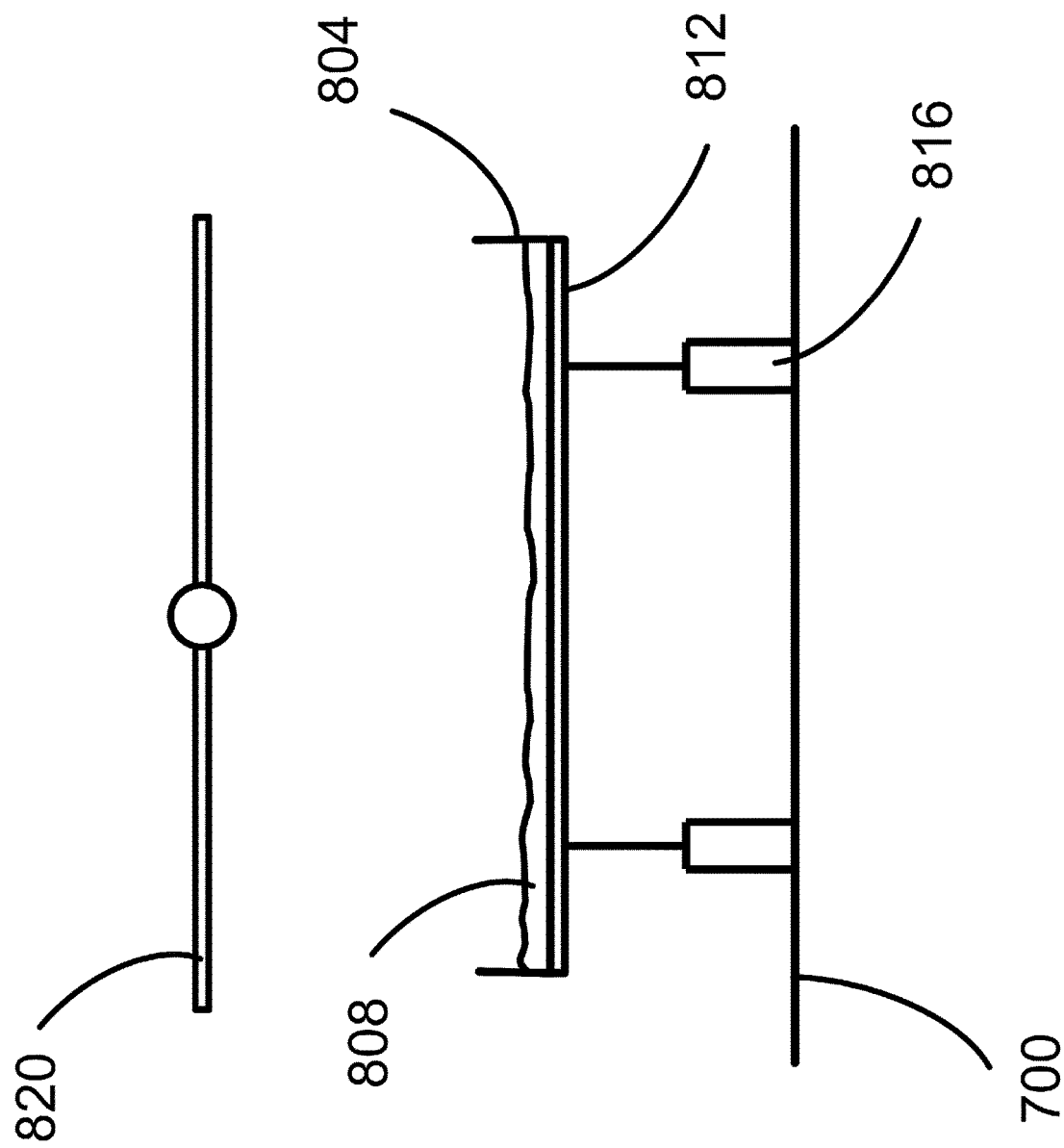
[Fig. 8]

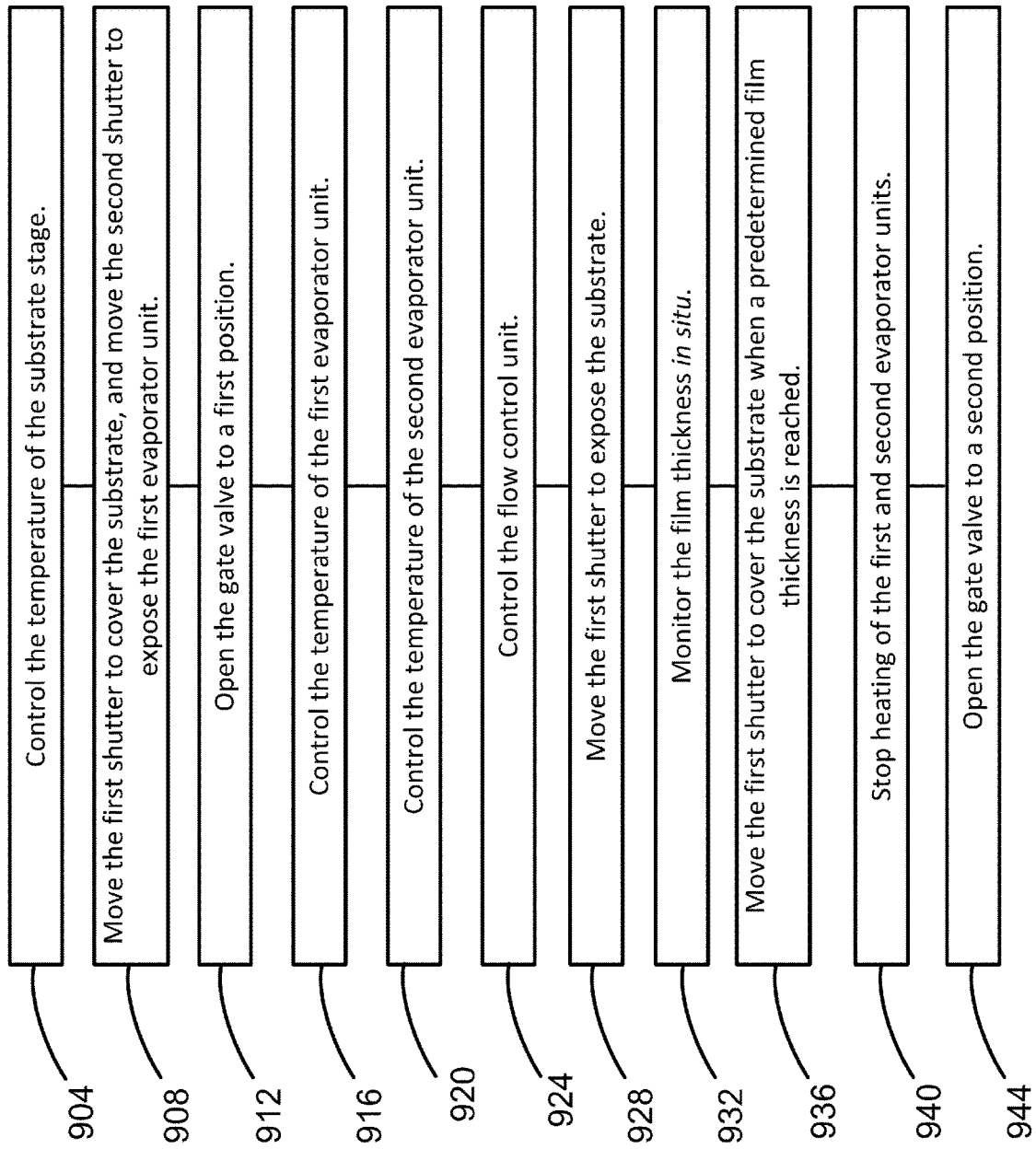
[Fig. 9]

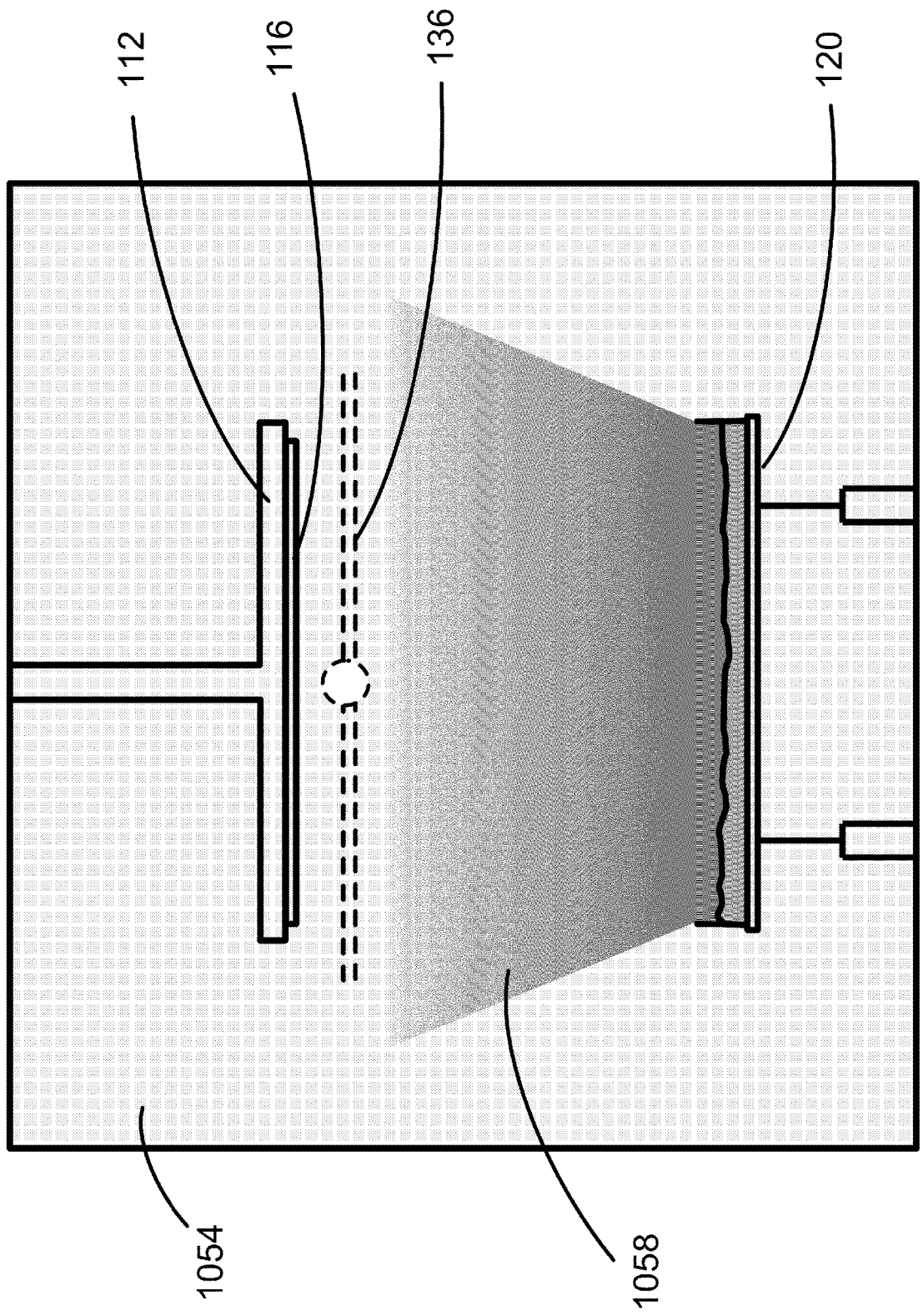
[Fig. 10]

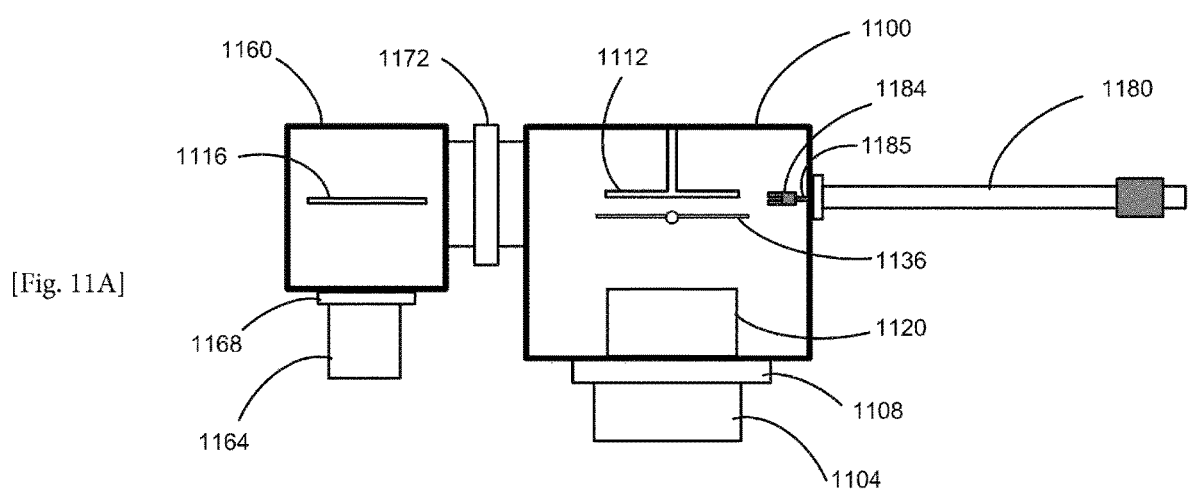
[Fig. 11A]
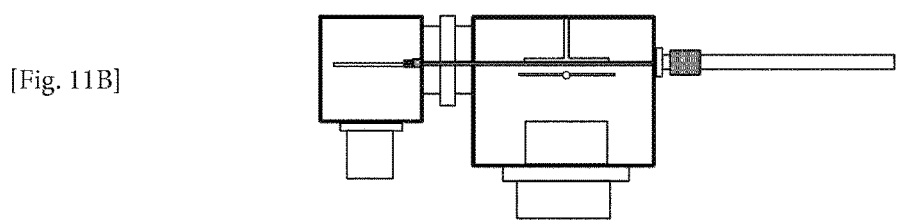
[Fig. 11B]
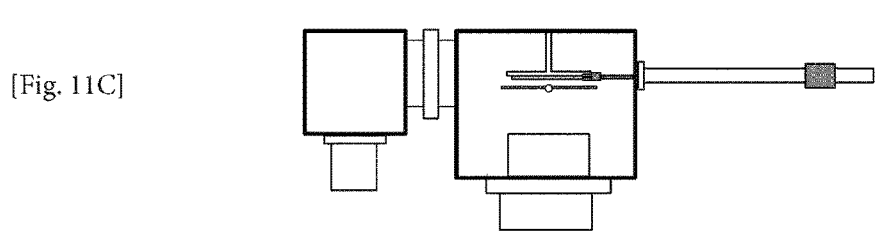
[Fig. 11C]
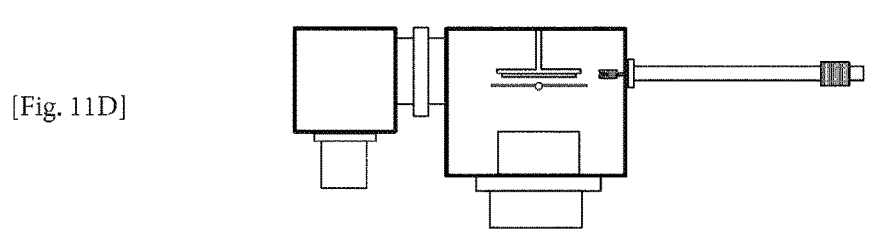
[Fig. 11D]

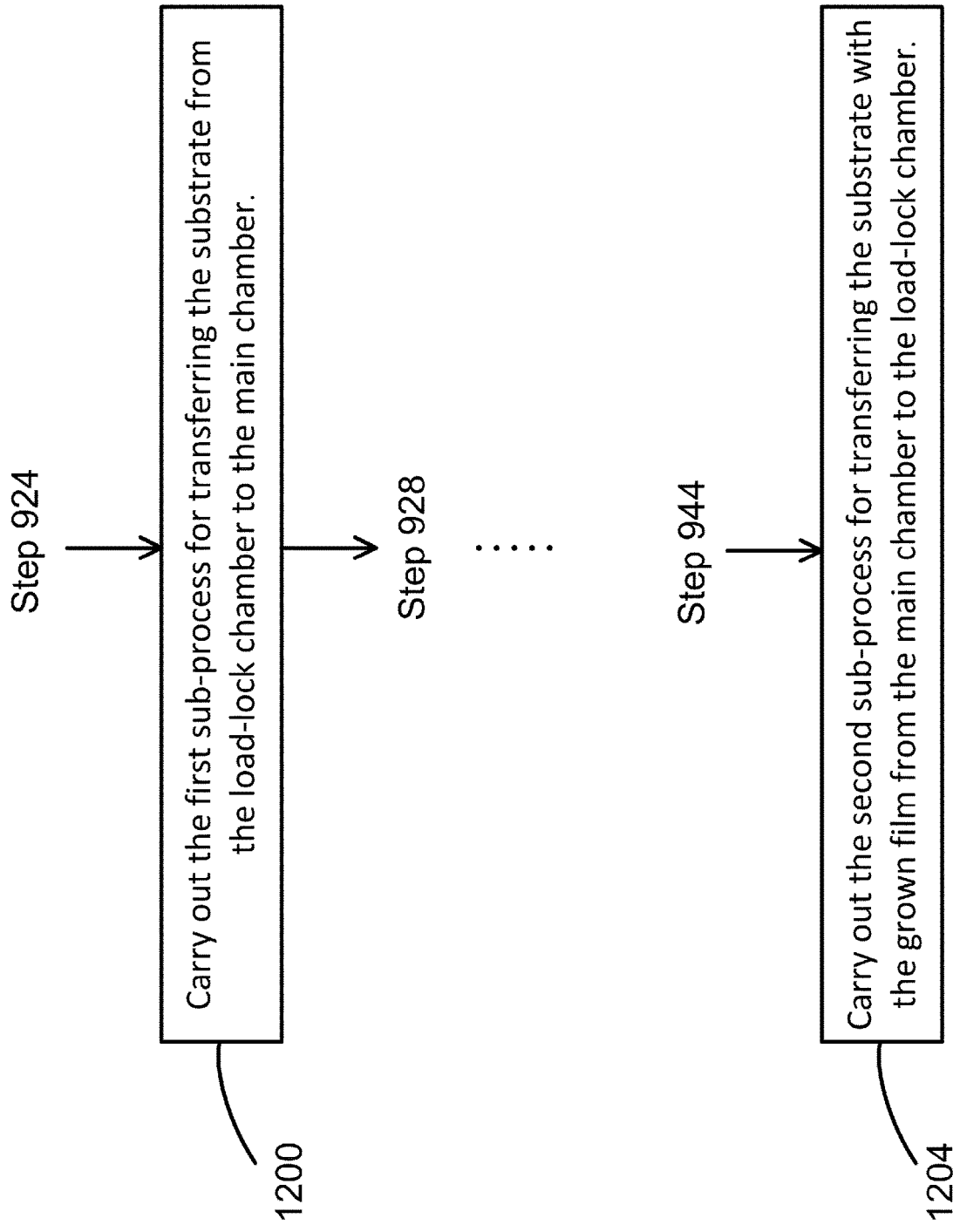
[Fig. 12]

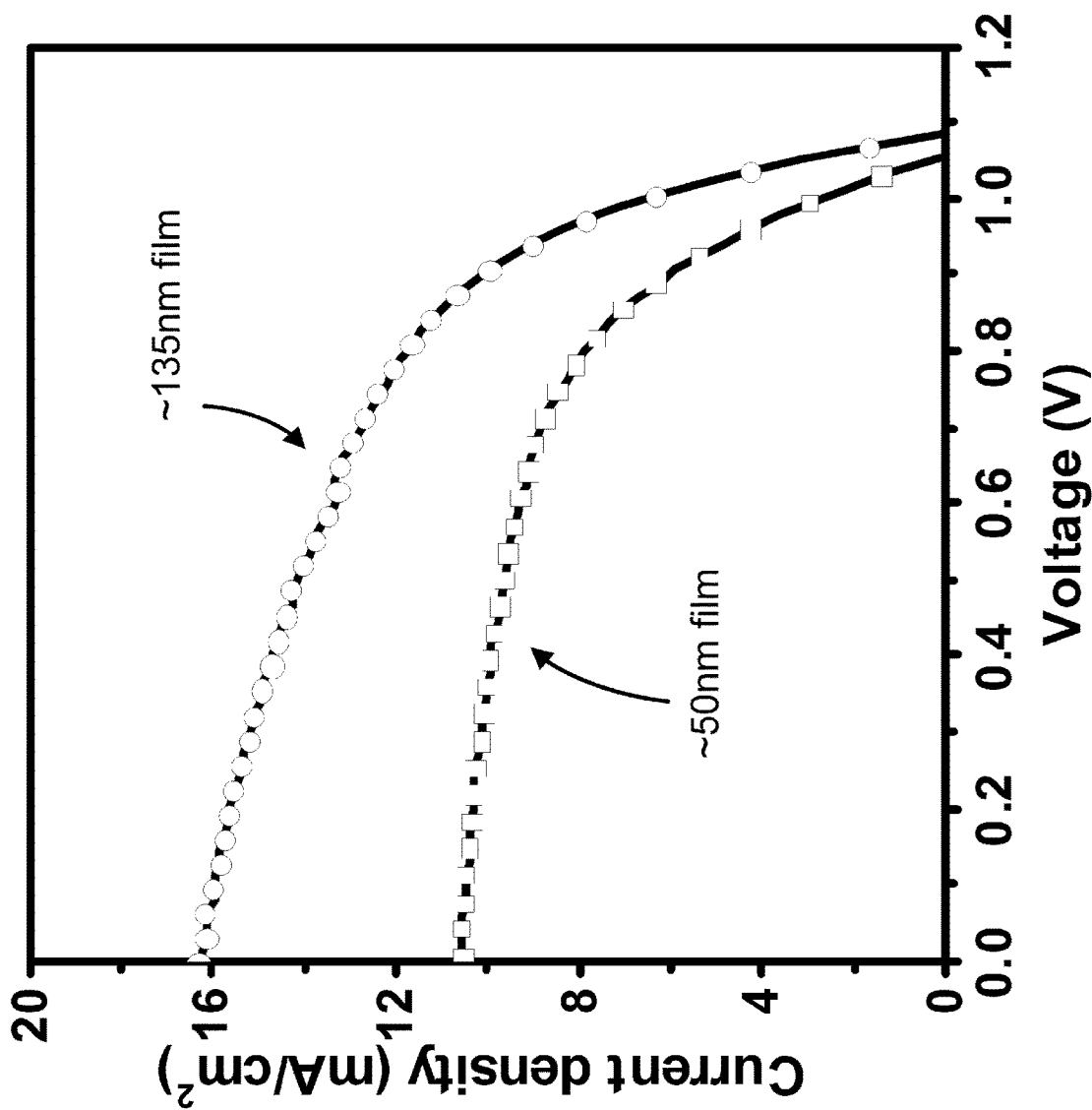
[Fig. 13]

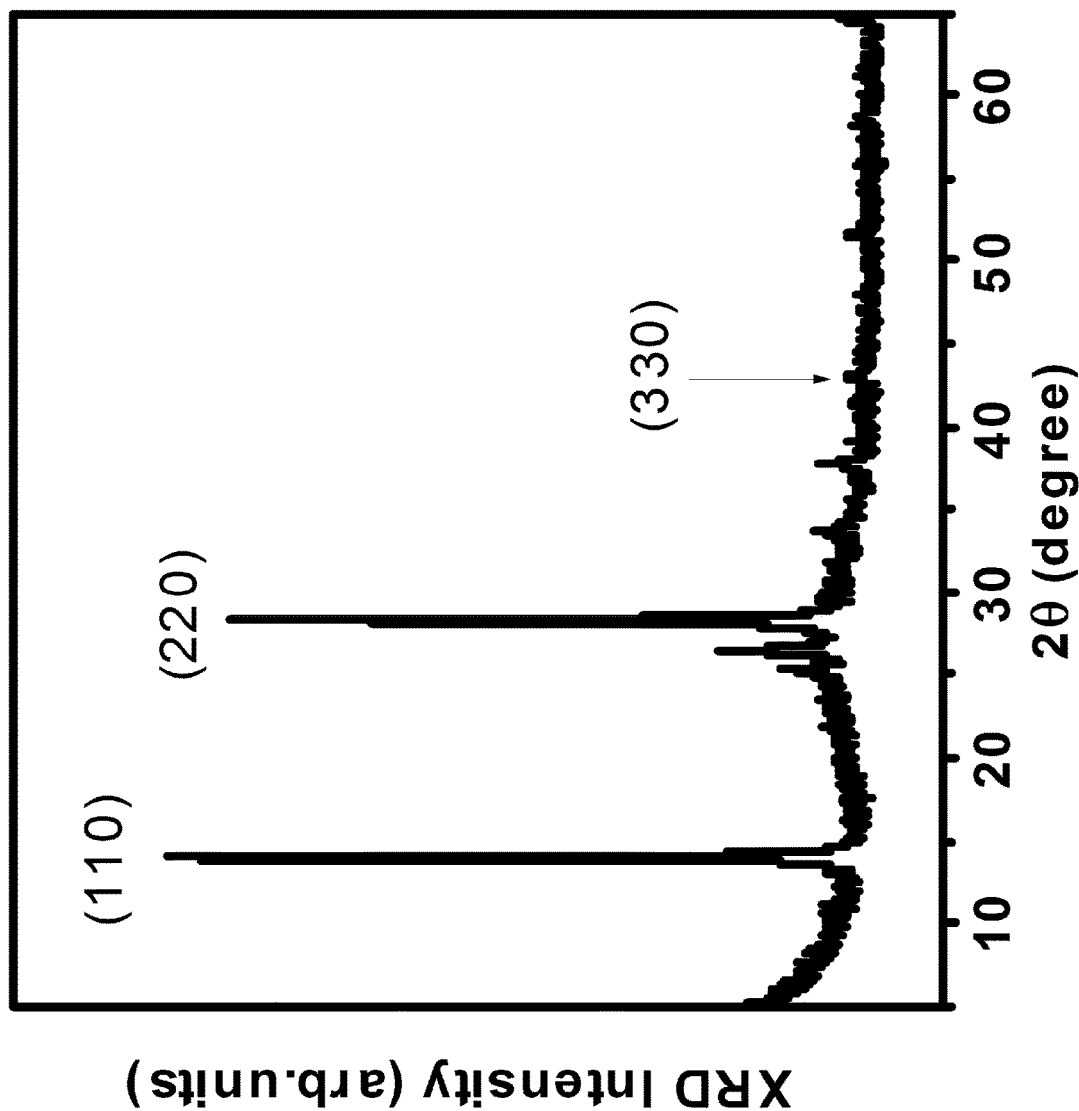
[Fig. 14]

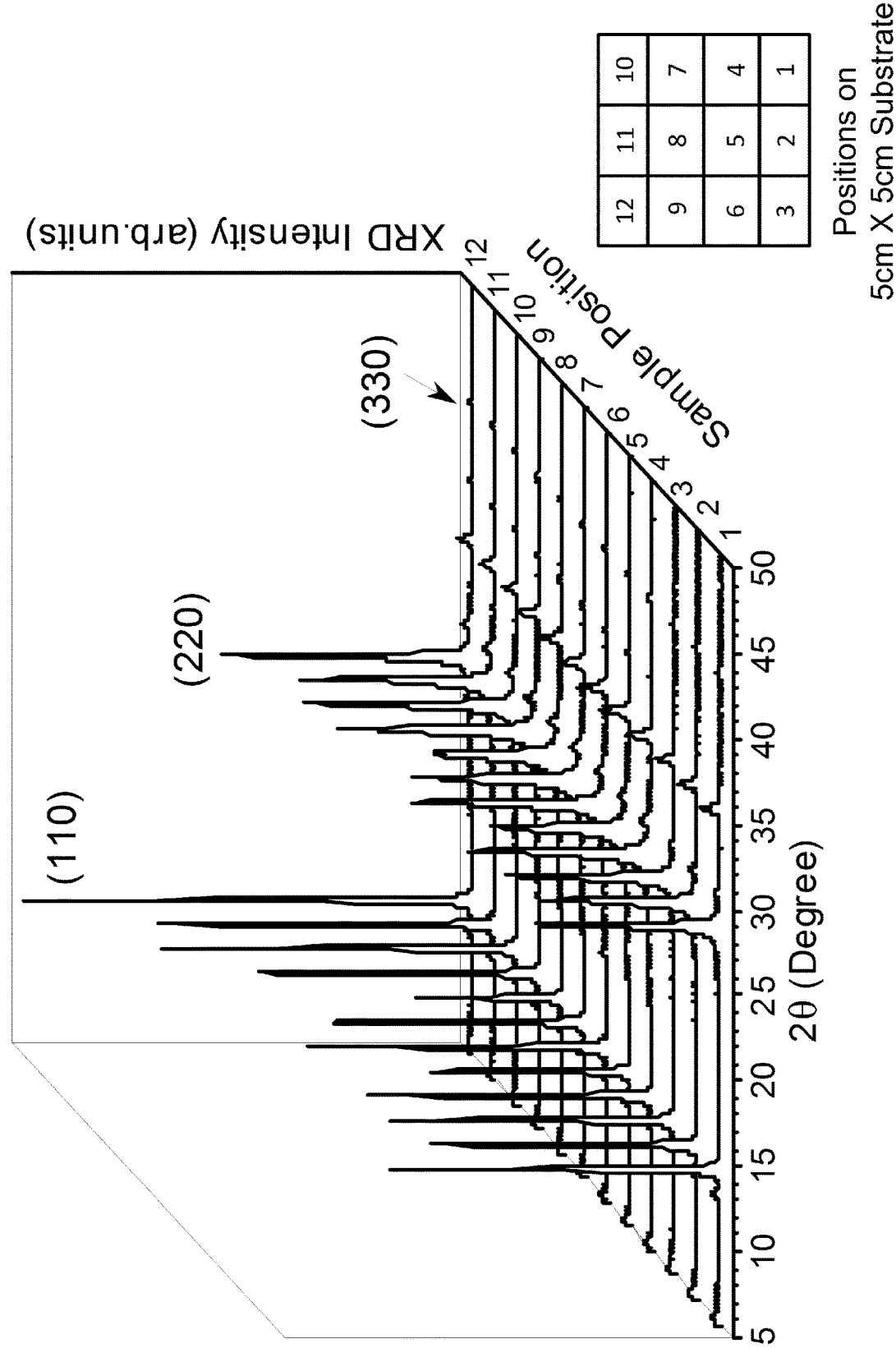
[Fig. 15]

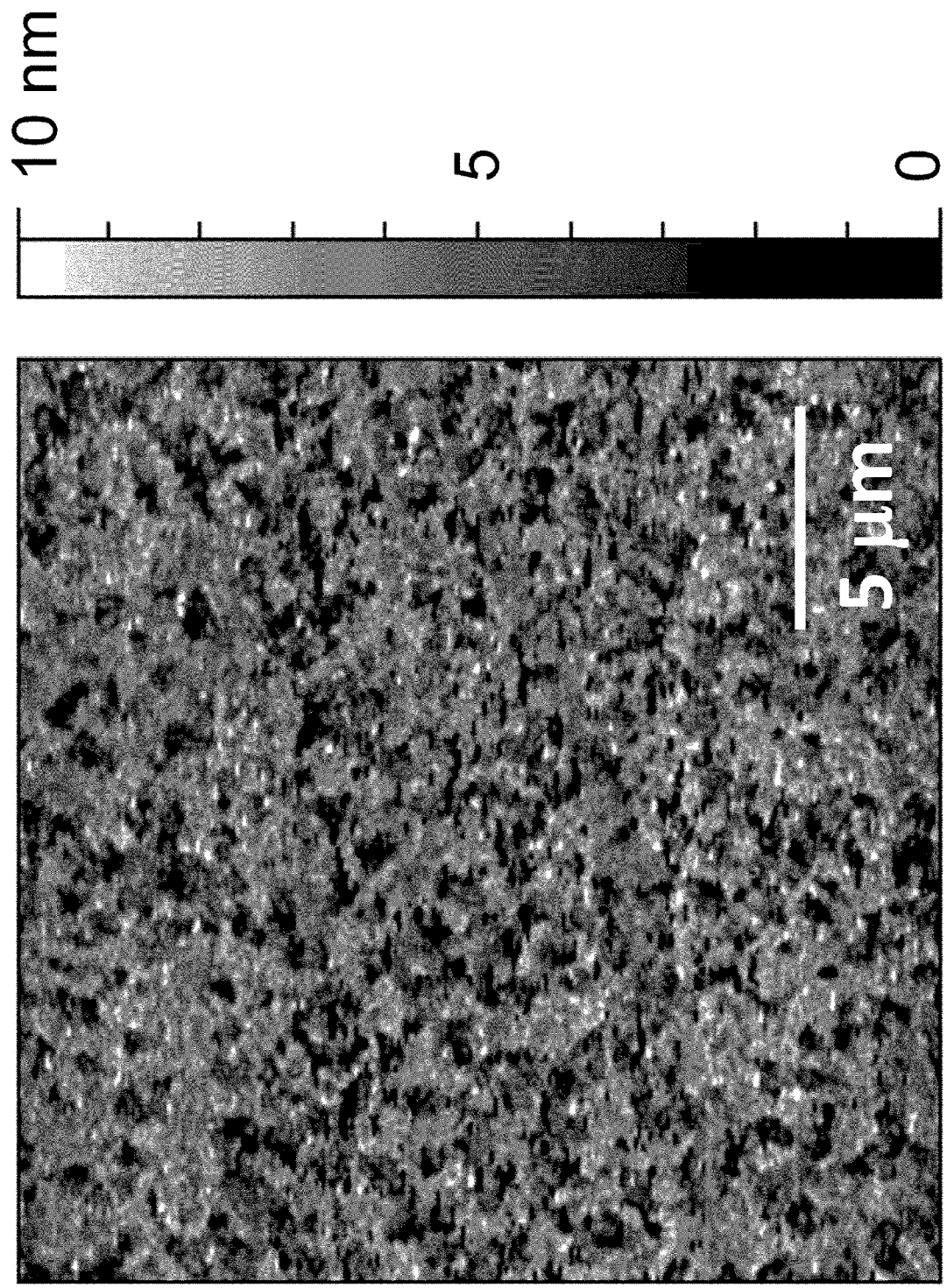
[Fig. 16]

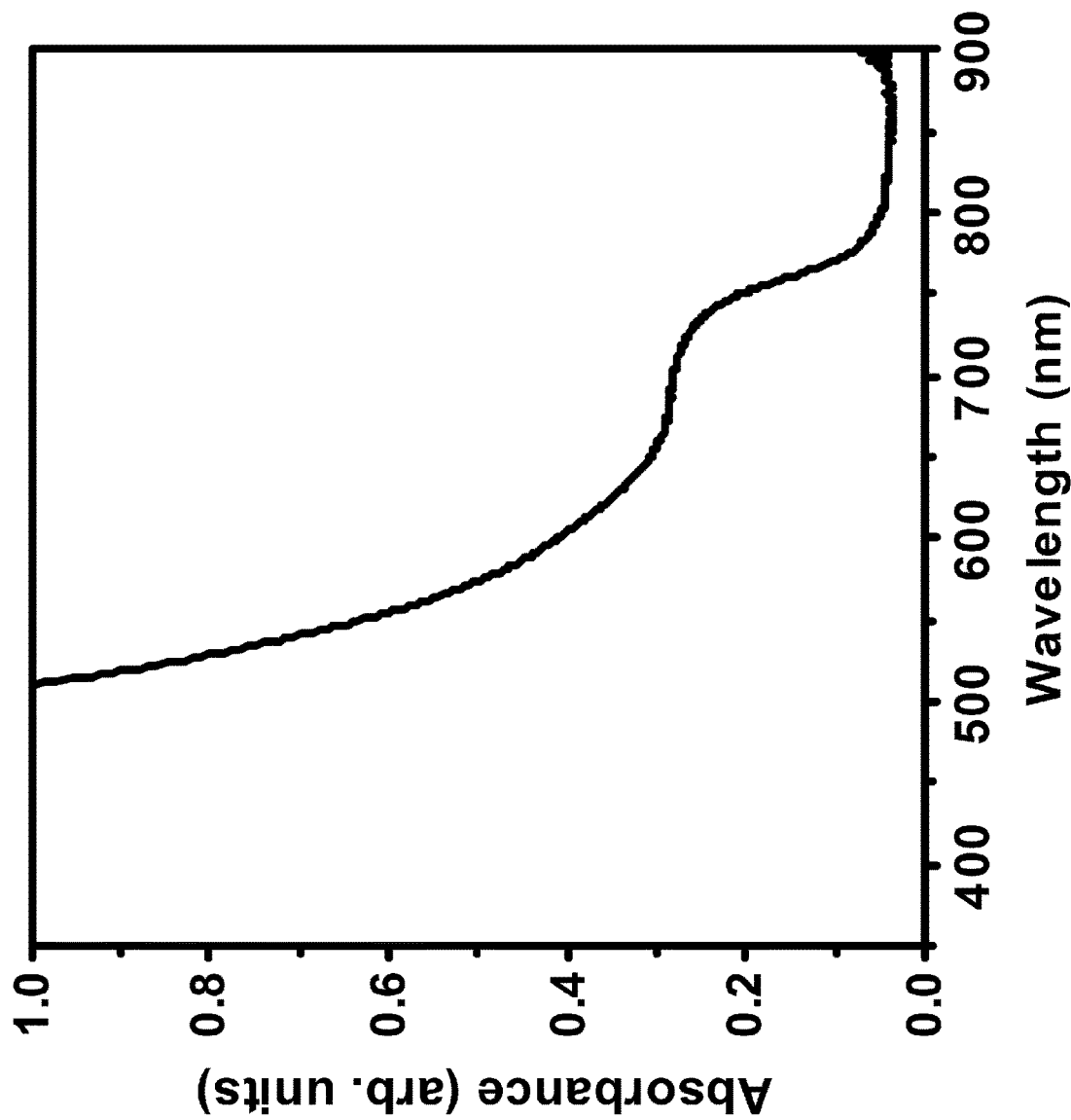
[Fig. 17]

[Fig. 18]
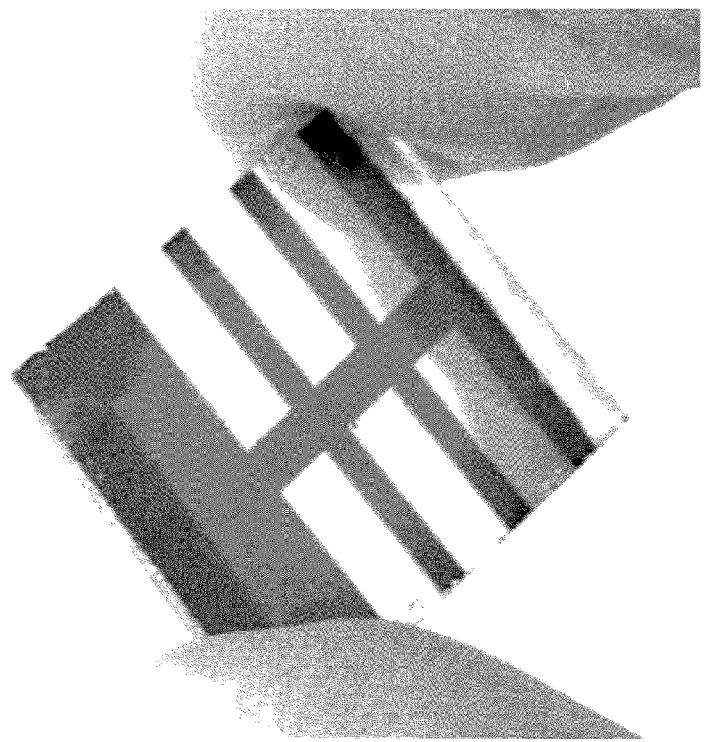
Film of ~135nm Thickness
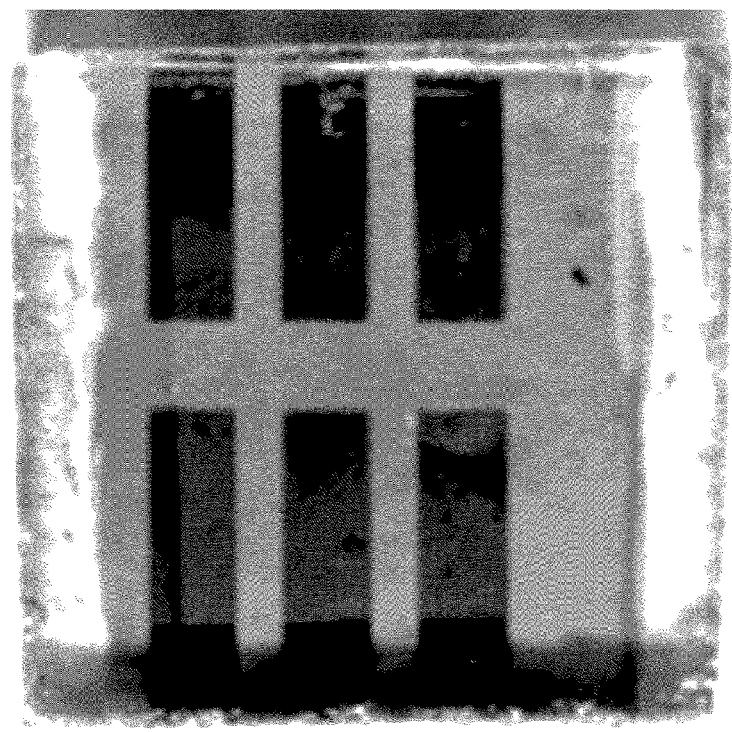
Film of ~50nm Thickness

SYSTEM AND METHOD FOR FABRICATING PEROVSKITE FILM FOR SOLAR CELL APPLICATIONS

CROSS-REFERENCE TO RELATED APPLICATIONS

This application is a divisional of U.S. application Ser. No. 15/308,822, filed on Nov. 3, 2016, which is a 371 of International Application No. PCT/JP2015/002041, filed on Apr. 10, 2015, which is based upon and claims the benefit of Provisional Patent Application No. 61/988,547, filed on May 5, 2014, the entire contents of which are incorporated herein by reference.

TECHNICAL FIELD

The present invention relates to a system and a method for fabricating perovskite film for solar cell applications.

BACKGROUND ART

A solar cell (also called a photovoltaic cell) is an electrical device that converts solar energy directly into electricity by using semiconductors that exhibit the photovoltaic effect. Solar photovoltaics is now, after hydro and wind power, the third most important renewable energy source in terms of globally installed capacity. Constructions of these solar cells are based around the concept of a p-n junction, wherein photons from the solar radiation are converted into electron-hole pairs. Examples of semiconductors used for commercial solar cells include monocrystalline silicon, polycrystalline silicon, amorphous silicon, cadmium telluride, and copper indium gallium diselenide. Solar cell energy conversion efficiencies for commercially available cells are currently reported to be around 14-22%.

High conversion efficiency, long-term stability and low-cost fabrication are essential for commercialization of solar cells. For this reason, a wide variety of materials have been researched for the purpose of replacing conventional solar cell semiconductors. For example, the solar cell technology using organic semiconductors is relatively new, wherein these cells can be processed from liquid solution, potentially leading to inexpensive, large scale production. Besides organic materials, organometal halide perovskites, $CH_3NH_3PbX_3$, where X=Cl, Br, I or a combination thereof, have recently emerged as a promising material for the next generation of high efficiency, low cost solar technology. In addition, they exhibit flexible properties that enable innovative device structures, such as Tandem cells (e.g. combination of $PbX_2$, $CH_3NH_3PbX_3$, and Pb-free perovskites), gradient concentration cells, and other high throughput structures. It has been reported that these synthetic perovskites exhibit high charge carrier mobility and lifetime that allow light-generated electrons and holes to move far enough to be extracted as current, instead of losing their energy as heat within the cell. These synthetic perovskites can be fabricated by using the same thin-film manufacturing techniques as those used for organic solar cells, such as solution processing and vacuum evaporation techniques.

However, to date, it has been difficult to obtain large-area highly uniform perovskite films based on the existing fabrication techniques, and practical perovskite-based solar devices are essentially non-existent. In view of ever increasing needs for highly efficient and stable solar cells at low cost, a new fabrication system and method are desired for producing large scale, highly uniform perovskite films suited for solar cell applications.

CITATION LIST

Non Patent Literature

[NPL 1]
Julian Burschka et al., Sequential deposition as a route to high-performance perovskite-sensitized solar cells. Nature, vol. 499, 316-320 (2013).
[NPL 2]
Mingzhen Liu et al., Efficient planar heterojunction perovskite solar cells by vapour deposition. Nature, vol. 000, 1-8 (2013).
[NPL 3]
Dianyi Liu et al., Perovskite solar cells with a planar heterojunction structure prepared using room-temperature solution processing techniques. Nature Photonics, vol. 8 133-138 (2014).
[NPL 4]
Olga Malinkiewicz et al., Perovskite solar cells employing organic charge-transport layers. Nature Photonics, vol. 8 128-132 (2014).
[NPL 5]
Nam-Gyu Park, Organometal Perovskite Light Absorbers Toward a 20% Efficiency Low-Cost Solid-State Mesoscopic Solar Cell. J. Phys. Chem. Lett. 2423-2429 (2013).

SUMMARY

According to an aspect of the invention, there is provided a system for fabricating a perovskite film for solar cell applications, by using source materials AX and $BX_2$, wherein the AX is an organic halide material and the $BX_2$ is a metal halide material, wherein the halogen X in the AX and the halogen X in the BX2 are the same element or different elements, the system comprising: a housing for use as a vacuum chamber, the housing having a side section along a vertical direction and top and bottom sections along a horizontal direction; a substrate stage coupled to the top section of the housing and configured to have a stage surface facing vertically downward for a substrate to be placed on; a first evaporator unit coupled to the bottom section of the housing and configured to generate $BX_2$ vapor; a second evaporator unit coupled to the housing and configured to generate AX vapor; and a flow control unit coupled to the housing for controlling circulation of the AX vapor in the housing, wherein dimensions of a horizontal cross-sectional shape of the first evaporator unit, dimensions of a horizontal cross-sectional shape of the substrate stage, and a relative position in the horizontal direction between the two horizontal cross-sectional shapes are configured to maximize an overlap between the two horizontal cross-sectional shapes.

FIG. 1 illustrates an example of the system configuration for fabricating a perovskite film according to an embodiment.

FIG. 2 illustrates a vertical view from below with respect to the cross-sectional plane indicated by X-X' in FIG. 1.

FIG. 3 illustrates a vertical view from above with respect to the cross-sectional plane indicated by Y-Y' in FIG. 1.

FIGS. 4A and 4B illustrate examples of the second evaporator unit 124 of the system in FIG. 1.

FIGS. 5A-5C illustrate an example of the first evaporator unit 120 of the system in FIG. 1.

FIGS. 6A and 6B illustrate examples of the flow control unit 128 of the system in FIG. 1.

FIG. 7 illustrates another example of the system configuration for fabricating a perovskite film according to an embodiment.

FIG. 8 illustrates a side view of a third example of the second evaporator unit of the system in FIG. 7.

FIG. 9 is a flowchart illustrating the fabrication method of a perovskite film using the present system illustrated in FIG. 1 or FIG. 7.

FIG. 10 schematically illustrates the deposition mechanism according to the present system and method.

FIGS. 11A-11D illustrate a sequence of system configurations including a load-lock chamber.

FIG. 12 is a flowchart illustrating the fabrication method of a perovskite film using the present system including a load-lock chamber.

FIG. 13 is a plot of the J-V curve representing the photovoltaic device characterization of a solar cell including the chloride iodide perovskite film, $CH_3NH_3PbI_{3-X}Cl_X$, grown by the present fabrication system and method.

FIG. 14 is a plot showing the X-ray diffraction (XRD) spectrum of the $CH_3NH_3PbI_{3-X}Cl_X$ film with a thickness of ~50 nm.

FIG. 15 is a plot showing the X-ray diffraction (XRD) spectra measured at 12 different locations of the $CH_3NH_3PbI_{3-X}Cl_X$ film of ~135 nm thickness grown on a tin-doped indium oxide (ITO)/glass substrate with a 5 cm×5 cm surface area.

FIG. 16 is a photo showing the atomic force microscopy (AFM) image of the $CH_3NH_3PbI_{3-X}Cl_X$ film of ~50 nm thickness grown on the ITO/glass substrate.

FIG. 17 is a plot showing the optical absorption of the $CH_3NH_3PbI_{3-X}Cl_X$ film of ~135 nm thickness.

FIG. 18 shows photos of actual devices including the $CH_3NH_3PbI_{3-X}Cl_X$ films of ~50 nm thickness and ~135 nm thickness, respectively.

In view of ever increasing needs for highly efficient and stable solar cells at low cost, this document describes a new fabrication system and method for producing highly crystalline, large scale, substantially uniform perovskite films suited for solar cell applications. The present fabrication method may be characterized as a hybrid of chemical vapor deposition and physical vapor deposition techniques, wherein vapor sources and associated parts in a vacuum chamber are configured to optimize the deposition quality by utilizing material characteristics of each source material. Here, the first category of source materials include metal halide materials such as $PbCl_2$, $PbBr_2$, $PbI_2$, $SnCl_2$, $SnBr_2$, $SnI_2$ and the like, and the second category of source materials include methylammonium (MA=$CH_3NH_3^+$) compounds such as MACl, MABr, MAI and the like, formamidinium (FA=$HC(NH_2)_2^+$) compounds such as FACl, FABr, FAI and the like, and 5-aminovaleric acid (5-AVA). (See, for example, Science 345, 295-298 (2014); Nature 517, 476-480 (2015).) An organometal halide perovskite structure is the orthorhombic structure having the general $ABX_3$ structure as the unit cell, in which an organic element, MA, FA or 5-AVA, occupies the site A; a metal element, $Pb^{2+}$ or $Sn^{2+}$, occupies the site B; and a halogen element, $Cl^-$, $I^-$ or $Br^-$, occupies the site X. In this document, AX represents an organic material having an organic element A selected from a group consisting of MA, FA and 5-AVA and a halogen element X selected from a group consisting of Cl, I and Br, or a combination of two or more of the organic materials. Here, a combination refers to a mixture of two or more of the above organic materials, MAI and MACl in mixed powder form, for example, which can be used for the deposition if the respective evaporation temperatures fall within a predetermined temperature range. A combination also refers to a mixed compound of two or more of the above organic materials, such as $MAI_{(1-X)}Cl_X$. Furthermore, in this document, $BX_2$ represents a metal halide material having a metal element B selected from a group consisting of Pb and Sn and a halogen element X selected from a group consisting of Cl, I and Br, or a combination of two or more of the metal halide materials. Here, again, a combination refers to a mixture of two or more of the above metal halide materials in mixed powder form, which can be used for the deposition if the respective evaporation temperatures fall within a predetermined temperature range. A combination also refers to a mixed compound of two or more of the above metal halide materials, such as $Pb_{(1-X)}Sn_XI_2$. Examples of implementations according to the present system and method are described below with reference to accompanying drawings.

FIG. 1 illustrates an example of the system configuration for fabricating a perovskite film according to an embodiment. The system includes a housing 100 coupled to necessary parts. The housing 100 can have a shape of substantially a hollow cylinder, having a side section along the vertical direction and top and bottom sections along the horizontal direction. The shape of the housing 100 can be of substantially a hollow box having four rectangular faces as the side section along the vertical direction, one rectangular face as the top section along the horizontal direction, and another rectangular face as the bottom section along the horizontal direction. The shape of the housing 100 can be adapted to have any shape as long as necessary parts can be properly coupled to the housing 100. Each section has an internal surface and an external surface. In FIG. 1, only the internal surfaces of the housing 100 are illustrated. The housing 100 is coupled to a pump unit 104 for generating near vacuum in the housing 100, which is used as a vacuum chamber for the deposition process. Examples of the pump unit 104 include a turbo molecular pump. A gate valve 108 is coupled in this example between the pump unit 104 and the housing 100 to control the pressure inside the housing 100, wherein the open/close of the gate valve 108 can be controlled manually, by use of a computer or any other suitable means. The gate valve 108 can be positioned to adjust the pressure inside the housing 100 to a value optimal for the chemical reaction between the source materials and for efficient use of the source materials. The pump unit 104 and the gate valve 108 can be coupled to the bottom section, as illustrated in FIG. 1, to the side section or any other suitable section of the housing 100. The pressure inside the chamber may be monitored by a pressure gauge over a full range, i.e., $1 \times 10^5 \sim 1 \times 10^{-7}$ Pa. A substrate stage 112 is coupled to the top section of the housing 100 and configured to have a large stage surface facing downward for a substrate 116 to be staged facing downward. The term "substrate" in this document is referred to as a one-piece substrate or a collection of multiple substrates in this document. The area of the stage surface in the present system can be configured to accommodate a large substrate, for example, 5 cm×5 cm or larger, or a multiple substrates with a total area of 5 cm×5 cm or larger. The shape of the stage surface 112 can be a circle, a square, a rectangle, or any other shape, as long as such a large substrate or multiple substrates can be accommodated. The temperature of the substrate stage 112 is controlled to provide uniform cooling or heating to the substrate 116. In a specific example, the temperature of the substrate stage 112 is controlled to range from −190° C. up to 200° C. A first evaporator unit 120 is coupled to the bottom section of the housing 100, and is configured for generating vapor of the metal halide material $BX_2$. A first evaporation temperature is associated with the first evaporator unit 120, and is controlled to adjust a first evaporation rate for generating the $BX_2$ vapor. The dimensions of the horizontal cross-sectional shape of the first evaporator unit 120, the dimensions of the horizontal cross-sectional shape of the substrate stage 112, and the relative position in the horizontal direction between the above two horizontal cross-sectional shapes are configured to maximize the overlap between the two horizontal cross-sectional shapes. For example, the substrate stage 112 has a horizontal cross-sectional shape of a 6 cm×6 cm square; the first evaporator unit 120 has a horizontal cross-sectional shape of a circle with a 6 cm diameter; and the center of the square and the center of the circle are vertically aligned. In another example, each of the substrate stage 112 and the first evaporator unit 120 has a horizontal cross-sectional shape of a circle with a 10 cm diameter; and the centers of these two circles are vertically aligned.

A second evaporator unit 124 is coupled to the side section of the housing 100 in this example, and is configured for generating vapor of the organic material AX. As described in a later example, the second evaporator unit 124 can be coupled to the bottom section of the housing 100, separated from the first evaporator unit 120 by a predetermined distance. A second evaporation temperature is associated with the second evaporator unit 124, and is controlled to adjust a second evaporation rate for generating the AX vapor. The chamber body, i.e., the body of the housing 100, may be kept at ~70° C. which helps to reduce the adsorption of the AX vapor onto the chamber wall.

A flow control unit 128 is provided at the side section of the housing 100 in this example in order to control the AX vapor flow to circulate it effectively in the housing 100. The flow control unit 128 is provided at the side section, substantially opposite to the second evaporator unit 124 in this example. However, the flow control unit 128 may be coupled to the housing 100 at any position with respect to the position of the second evaporator unit 124 as long as it facilitates a substantially uniform flow of the AX vapor over the substrate 116. The flow control unit 128 may comprise one or more mechanical systems to promote the circulation of the AX vapor in the housing 100. Examples of the flow control unit 128 include a fan system, a pump system, and a combination thereof. Examples of the pump system include a foreline pump. In the combination example, the fan system may be provided on the same side as and above the second evaporator unit 124, and the pump system may be provided opposite to the second evaporator unit 124. In another example, the flow control unit 128 may be configured to have only the pump system, which is coupled to the side section substantially opposite to the second evaporator unit 124 and substantially leveled with the stage surface of the substrate stage 112 to promote the uniformity of the AX vapor over the substrate 116.

A first monitor 132 may be coupled to the top section of the housing 100, in the proximity of the stage surface of the substrate stage 112, in order to monitor the perovskite film thickness in situ. The first monitor 132 can be used to monitor the vapor flow of the metal halide material $BX_2$ from the first evaporator unit 120 as well as the film thickness. Monitoring the $BX_2$ vapor flow helps assessing the deposition rate of the metal halide material $BX_2$. The sensor section of the first monitor 132 may be configured to face downward, for example, as indicated in FIG. 1. A second monitor 134 may be coupled to the top section of the housing 100 as indicated in FIG. 1 or to the side section of the housing 100, in order to monitor the vapor flow of the organic source AX from the second evaporator unit 124. Monitoring the AX vapor flow helps assessing the deposition rate and flow speed of the AX vapor. Depending on conditions, the sensor section of the second monitor 134 may be configured to face upward, as indicated in the example illustrated in FIG. 1, or sideways. Examples of the first and second monitors 132 and 134 include a quartz crystal thickness monitor, the temperature of which can be controlled to be held at substantially the same temperature as the substrate stage 112 so as not to thermally disturb the deposition process. The deposition rates and the film thickness in situ can be estimated based on the monitored evaporation rates using the tooling factor calculation. For example, in this calculation, the ratio between the measured film thickness and the indicated film thickness (as indicated by the monitored evaporation rates) is obtained during a trial run; thereafter, the ratio can be used to obtain the in situ film thickness by factoring in the evaporation rates during deposition as observed by the monitors.

A first shutter 136 is provided just below the substrate stage 112 and is configured to be moved to expose or cover the substrate stage 112 to control the deposition of the $BX_2$ molecules onto the substrate 116. A second shutter 140 is provided just above the first evaporator unit 120 and is configured to be moved to expose or cover the first evaporator unit 120 to control the flow of the $BX_2$ vapor.

FIG. 2 illustrates a vertical view from below with respect to the cross-sectional plane indicated by X-X' in FIG. 1. The internal side surface of the housing 100, the cross-sectional view of the flow control unit 128, the bottom surface of the first monitor 132 provided in the proximity to the substrate stage 112, the bottom surface of the second monitor 134, and the bottom surface of the first shutter 136 are illustrated in FIG. 2 as projected onto the cross-sectional plane X-X'. The first shutter 136 is attached with a first rod 138, which is used to move the first shutter 136 to expose or cover the substrate stage 112. A push-pull linear motion device, for example, may be coupled to the first rod 138 to provide longitudinal motion of the first shutter 136 along the axis of the first rod 138. Alternatively, the first shutter 136, the first rod 138 and their peripheral parts may be configured to control the exposing and covering of the substrate stage 112 by the first shutter 136 based on rotation thereof along the horizontal direction around a vertical axis, or any other suitable motion. The bottom surface of the substrate stage 112 is not visible when it is completely covered by the first shutter 136; however, it is visible, as indicated by thick solid line in FIG. 2, when the first shutter 136 is moved away to expose the bottom surface of the substrate stage 112.

FIG. 3 illustrates a vertical view from above with respect to the cross-sectional plane indicated by Y-Y' in FIG. 1. The internal side surface of the housing 100, the cross-sectional view of the second evaporator unit 124, and the top surface of the second shutter 140 are illustrates in FIG. 3 as projected onto the cross-sectional plane Y-Y'. The second shutter 140 is attached with a second rod 142, which is used to move the second shutter 140 to expose or cover the first evaporator unit 120. A push-pull linear motion device, for example, may be coupled to the second rod 142 to provide longitudinal motion of the second shutter 140 along the axis of the second rod 142. Alternatively, the second shutter 140, the second rod 142 and their peripheral parts may be configured to control the exposing and covering of the first evaporator unit 120 by the second shutter 140 based on rotation thereof along the horizontal direction around a vertical axis, or any other suitable motion. The top surface of the first evaporator unit 120 is not visible when it is completely covered by the second shutter 140; however, it is visible, as indicated by thick solid line in FIG. 3, when the second shutter 140 is moved away to expose the top surface of the first evaporator unit 120.

FIGS. 4A and 4B illustrate examples of the second evaporator unit 124 of the system in FIG. 1. Each example is illustrated as a configuration with respect to the internal side surface of the housing 100. FIG. 4A illustrates a cell evaporator, such as a conventional Knudsen cell evaporator, having a cell 404 accommodating a crucible 408, which is a container where the AX powder 412 can be contained. A heating element 416 is provided to heat the crucible 408, hence the AX powder 412, to generate its vapor. The second evaporation temperature is associated with the second evaporator unit 124, and is controlled to adjust the second evaporation rate for generating the AX vapor. Specifically, the temperature of the heating element 416 is controlled to adjust the AX evaporation rate, in this example. The cell evaporator also includes an evaporator shutter 420 to control the AX vapor flux. The cell evaporator of FIG. 4A is provided with an angle with respect to the internal side surface of the housing 100, wherein the angle can be adjusted to output the AX vapor efficiently. The evaporator shutter 420 is provided to control the AX flux exiting from the second evaporator unit 124 into the housing 100 to avoid the high flux of the AX vapor hitting directly the substrate 116. FIG. 4B illustrates another example of the second evaporator unit 124, which includes an ampule 424 that is a container to contain the AX powder 428, and a heating element 432 provided to heat the ampule 424, hence the AX powder 428, to generate its vapor. The second evaporation temperature is associated with the second evaporator unit 124, and is controlled to adjust the second evaporation rate for generating the AX vapor. Specifically, the temperature of the heating element 432 is controlled to adjust the AX evaporation rate, in this example. The second evaporator unit 124 illustrated in the example of FIG. 4B further includes a duct 436 to guide the AX vapor flux into the housing 100. The duct 436 is configured to have a vertically extending section 438 in this example to output the AX vapor vertically so that the flow control unit 128 provided above the second evaporator unit 124 can effectively circulate its flow in the housing 100. The duct 436 may be coupled to an evaporator valve 440 for controlling the AX vapor flow in a simple but timely manner.

FIGS. 5A-5C illustrate an example of the first evaporator unit 120 of the system in FIG. 1. FIG. 5A illustrates a cross-sectional side view, wherein the first evaporator unit 120 includes a crucible 504 that is a container to contain the $BX_2$ powder 508 and a heating element 512 to heat the crucible 504, hence the $BX_2$ powder 508, to generate its vapor. Two end terminals of the heating element 512 are held by two electric feedthroughs 516, respectively, to communicate with the outside of the housing 100, whereby the heating element 512 can be controlled externally. The first evaporation temperature is associated with the first evaporator unit 120, and is controlled to adjust the first evaporation rate for generating the $BX_2$ vapor. Specifically, the temperature of the heating element 512 is controlled to adjust the $BX_2$ evaporation rate, in this example. FIG. 5B illustrates a perspective view of the crucible 504, which has a dish shape in this example, with the diameter close to the dimension of the substrate stage 112. The horizontal cross-sectional shape of the crucible 504 can be a square, a rectangle, an oval, a hexagon or any other shape, as long as the area is configured to be close to the area of the substrate stage 112. As mentioned earlier, the dimensions of the horizontal cross-sectional shape of the first evaporator unit 120, the dimensions of the horizontal cross-sectional shape of the substrate stage 112, and the relative position in the horizontal direction between the above two horizontal cross-sectional shapes are configured to maximize the overlap between the two horizontal cross-sectional shapes. FIG. 5C illustrates a perspective view of the heating element 512, which is a spiral-shaped tungsten filament and tightly surrounds the dish-shaped crucible 504, in this example. The heating element 512 can be formed in a mesh shape, a meander shape, a zig-zag shape or any other shape, as long as it is configured to heat the crucible 504 uniformly to control the evaporation rate of the $BX_2$ source. In the present example, the diameter of the spiral is configured to be approximately the same as the diameter D of the dish-shaped crucible 504 of FIG. 5B.

FIGS. 6A and 6B illustrate examples of the flow control unit 128, which may be coupled to the side section of the housing 100. The example illustrated in FIG. 6A is a pump system, e.g., a foreline pump, including a funnel 604, a duct 608, a valve 612 and a pumping station 616, and being coupled to the side section of the housing 100 substantially opposite to the second evaporator unit 124. However, it can be coupled to the housing 100 at any position with respect to the position of the second evaporator unit 124 as long as the flow speed is controlled effectively to generate a substantially uniform flow of the AX over the substrate 116. The valve 612 may be coupled to the duct 608 to control the flow. Another example illustrated in FIG. 6B is a fan system including a fan 620, which is coupled to a rotary drive 624 coupled to a motor 628. In this example, the fan 620 is provided on the same side as the second evaporator unit 124, just above it on the side section of the housing 100, so as to uniformly circulate the AX vapor over the substrate 116. As mentioned earlier, the flow control unit 128 may comprise one or more mechanical systems to promote the uniformity of the AX vapor flow over the substrate 116. Examples of the flow control unit 128 include a fan system, a pump system and a combination thereof. In the combination example, the fan system may be provided on the same side as and above the second evaporator unit 124, and the pump system may be provided substantially opposite to the second evaporator unit 124. In another example, the flow control unit 128 may be configured to have only the pump system, which is coupled to the side section substantially opposite to the second evaporator unit 124 and substantially leveled with the stage surface of the substrate stage 112 to promote the uniformity of the AX vapor over the substrate 116.

FIG. 7 illustrates another example of the system configuration for fabricating a perovskite film according to an embodiment. The system includes a housing 700 coupled to necessary parts. The housing 700 serves as a vacuum chamber for the deposition. A pump unit 704, a gate valve 708, a substrate stage 712 for a substrate 716 to be placed on, a first evaporator unit 720 for generating vapor of the metal halide material $BX_2$, a flow control unit 728, a first monitor 732, a first shutter 736, and a second shutter 740 are similar to those parts explained earlier with reference to FIG. 1 or adapted in accordance with the present configuration while keeping the key functionalities by those skilled in the art. For example, the pump unit 704 and the gate valve 708 may be shifted in position and/or resized to accommodate additional parts at the bottom section of the housing 700, as modified or designed by those skilled in the art based on the system illustrated in FIG. 1. In the present system configuration in FIG. 7, a second evaporator unit 724 is coupled to the bottom section of the housing 700, separated from the first evaporator unit 720 by a predetermined distance, and configured to generate vapor of the organic material AX. A shield 725 is provided between the first evaporator unit 720 and the second evaporator unit 724 to reduce the thermal interference between them. A second monitor 734 is provided just above the second evaporator unit 724 to monitor the AX vapor flow to assess its deposition rate.

Similar to the second evaporator unit 124 of FIG. 1, examples of the second evaporator unit 724 include a cell evaporator such as a Knudsen cell evaporator explained with reference to FIG. 4A and an ampule-type evaporator explained with reference to FIG. 4B. FIG. 8 illustrates a side view of a third example of the second evaporator unit 724, which can be coupled to the bottom section of the housing 700. Similar to the crucible-type evaporator as used for the first evaporator unit 120, explained with reference to FIGS. 5A-5C, the third example of the second evaporator unit 724 includes a crucible 804 to contain the AX powder 808 and a heating element 812 to heat the crucible 804, hence the AX powder 808, to generate its vapor. Two end terminals of the heating element 812 are held by two electric feedthroughs 816, respectively, to communicate with the outside of the housing 700, whereby the heating element 812 can be controlled externally. The second evaporation temperature is associated with the second evaporation unit 724, and is controlled to adjust the second evaporation rate for generating the AX vapor. Specifically, the temperature of the heating element 812 is controlled to adjust the AX evaporation rate, in this example. The horizontal cross-sectional shape of the crucible 804 can be a circle, a square, a rectangle, an oval, a hexagon or any other shape. The heating element 812 may be a spiral-shaped tungsten filament tightly surrounding the crucible 804. The heating element 812 may be formed in a mesh shape, a meander shape, a zig-zag shape or any other shape, as long as it is configured to heat the crucible 804 uniformly to control the evaporation rate of the AX source material. An evaporator shutter 820 is provided above the crucible 804 in this example. The horizontal dimensions of the evaporator shutter 820 are configured to be larger than those of the crucible 804. The evaporator shutter 820 can be adjusted to cover the opening of the crucible 804 to avoid the high flux of the AX vapor exiting from the second evaporator unit 724 hitting directly the substrate 716.

FIG. 9 is a flowchart illustrating the fabrication method of a perovskite film using the present system illustrated in FIG. 1 or FIG. 7. The reference numerals in FIG. 1 are used below for explaining the process illustrated in FIG. 9; it should be noted that the same process can be carried out using the system illustrated in FIG. 7 as well. The substrate 116 can be initially provided on the substrate stage 112 facing downward. Alternatively, the substrate 116 can be provided on the substrate stage 112 later in the process, as explained with reference to FIGS. 11A-11D later. As mentioned earlier, the surface area of the substrate stage 112 in the present system can be configured to accommodate a large substrate, for example, 5 cm×5 cm or larger, or a multiple substrates with a total area of 5 cm×5 cm or larger. The inside of the housing 100 is pumped to a predetermined vacuum level by using the pump unit 104, and the housing 100 serves as a vacuum chamber. The pressure inside the chamber can be monitored by a pressure gauge over a full-range, i.e., $1 \times 10^5 \sim 1 \times 10^{-7}$ Pa. In the second evaporator unit 124 or 724, the evaporator shutter 420 of a cell evaporator illustrated in FIG. 4A, the evaporator valve 440 of an ampule-type evaporator illustrated in FIG. 4B, or the evaporator shutter 820 of a crucible-type evaporator illustrated in FIG. 8 is positioned to substantially cover the opening of the second evaporator unit 124 or 724 to avoid the high flux of the AX vapor exiting form the second evaporator unit 124 or 724 hitting directly the substrate surface.

In step 904 of the process illustrated in FIG. 9, the temperature of the substrate stage 112 is controlled to provide a predetermined substrate temperature. The temperature of the substrate stage 112 can be controlled to provide uniform cooling or heating to the substrate 116, ranging from −190° C. up to 200° C., in the present system. As explained later, experiments using substrates at various temperatures have suggested that a solar device with the perovskite film grown with the substrate at room temperature exhibits the best performance. Here, the room temperature refers to a temperature in the range of 15° C.-25° C. In step 908, the first shutter 136, which is provided just below the substrate stage 112, is moved to cover the substrate 116, while the second shutter 140, which is provided just above the first evaporator unit 120, is moved to expose the first evaporator unit 120. The gate valve 108 coupled between the housing 100 and the pump unit 104 is positioned to adjust the pressure inside the housing 100 to a value optimal for the chemical reaction between the source materials and for efficient use of the source materials. In particular, the AX vapor pressure inside the chamber is primarily determined by the gate valve positioning. That is, as in step 912, setting the gate valve 108 to a first position, which may be predetermined, can help stabilize the AX vapor circulation in the chamber. For example, a relatively high pressure of ~0.3 Pa may be applied and kept substantially constant via the gate valve positioning during the perovskite formation. In step 916, the first temperature associated with the first evaporator unit 120, which is configured to source the $BX_2$ vapor, is controlled to adjust the first evaporation rate for generating the $BX_2$ vapor. For example, in the crucible-type evaporator illustrated in FIGS. 5A-5C, the crucible 504 can be heated by the heating element 512 to a temperature that generates the $BX_2$ vapor at a predetermined first evaporation rate. The $BX_2$ rate can be monitored by the first monitor 132. When the first evaporation rate of the $BX_2$ material reaches a certain rate, in step 920, the second temperature associated with the second evaporator unit 124, which is configured to source the AX vapor, is controlled to adjust the second evaporation rate for generating the AX vapor. For example, in the Knudsen-type cell evaporator illustrated in FIG. 4A, the crucible 408 can be heated by the heating element 416 to a temperature that generates the AX vapor at a predetermined second evaporation rate. The AX rate is monitored by the second monitor 134. The second monitor 134 is used to monitor the AX vapor flow to assess the evaporation rate and to check if the flow is kept substantially constant inside the housing 100.

The present deposition process involves evaporation of two materials with distinctively different evaporation temperatures. For example, $PbI_2$ typically evaporates at ~250° C., while MAI evaporates at ~70° C. The organic materials AX are typically highly volatile. In step 924, the flow control unit 128 is controlled to adjust the flow speed of the AX vapor to circulate it in the housing 100 and to promote the uniformity of the AX vapor flow over the substrate surface 116. The AX vapor pressure inside the chamber is primarily determined by the gate valve positioning. That is, setting the gate valve 108 to the first position can help stabilize the AX vapor circulation in the chamber. Thus, the circulation of the AX vapor in the chamber is optimized in the present system, based comprehensively on: (i) the second evaporation temperature associated with the second evaporator unit 124 for controlling the evaporation rate of the AX material; (ii) the pressure inside the chamber adjusted by positioning the gate valve 108 for controlling the AX vapor pressure; and (iii) the flow control of the AX vapor by the flow control unit 128.

In step 928, the first shutter 136, which is provided just below the substrate stage 112, is moved to expose the substrate 116 to start the deposition of the $BX_2$ molecules onto the substrate 116. In step 932, the thickness of the perovskite film growing on the substrate 116 is monitored in situ by the first monitor 132, which is provided in the proximity of the stage surface of the substrate stage 112. The temperature of the first and second monitors 132 and 134 can be controlled to be held at substantially the same temperature as the substrate stage 112 so as not to thermally disturb the deposition process. In step 936, when the film thickness reaches a predetermined thickness, the first shutter 136 is moved to cover the substrate 116 to interrupt the deposition of the $BX_2$ molecules onto the substrate 116. In step 940, the heating of the first evaporator unit 120 and the second evaporator unit 124 is stopped. In step 944 the gate valve 108 is opened to a second position, which can be a maximum open position, to pump out the remaining vapor from the chamber. Experiments suggested that post annealing of the resultant perovskite film is not necessary.

Physical vapor deposition is an example of fabrication technique used in semiconductors, microelectronics and optical industries. The source material is typically heated and vaporized until its vapor pressure is high enough to produce a flux. The deposition onto the substrate involves purely physical process such as high-temperature vacuum evaporation with subsequent condensation or plasma sputter bombardment. Thus, line-of-sight transfer is typical for most of physical vapor deposition techniques, in which the direction of the vapor flux of the source material is directed toward the substrate. Since particles tend to follow a straight path, films deposited by physical vapor deposition are generally directional, rather than conformal. In contrast, in chemical vapor deposition, chemical reaction takes place on the substrate surface to produce the conformal uniform morphology.

In view of the conventional chemical and physical vapor deposition techniques, the fabrication technique based on the present system and method may be regarded as a hybrid of the two techniques. FIG. 10 schematically illustrates the deposition mechanism according to the present system and method. The reference numerals for some of the system parts in FIG. 1 are used below for explaining the deposition mechanism schematically illustrated in FIG. 10; however, it should be noted that the explanations herein are applicable as well to the system illustrated in FIG. 7. In FIG. 10, the stabilized evaporations are depicted after the process step 928 in FIG. 9, where the first shutter 136 (shown in dashed line) was moved to expose the substrate 116. It is illustrated here that the AX vapor 1054 circulates substantially uniformly to fill the chamber. This is enabled by adjustments of the first evaporation rate for generating the AX vapor via the temperature control of the second evaporator unit 124 (omitted in the figure for simplicity), the pressure inside the chamber via the positioning of the gate valve 108 for controlling the AX vapor pressure, and the flow speed of the AX vapor via the flow-speed control of the flow control unit 128. The $BX_2$ material is heated uniformly in the first evaporator unit 120 that has a large horizontal cross-sectional area, and the resultant $BX_2$ vapor 1058 travels substantially vertically directing to the substrate 116, which has a surface area close to the horizontal cross-sectional area of the first evaporator unit 120. As mentioned earlier, the dimensions of the horizontal cross-sectional shape of the first evaporator unit 120, the dimensions of the horizontal cross-sectional shape of the substrate stage 112, and the relative position in the horizontal direction between the above two horizontal cross-sectional shapes are configured to maximize the overlap between the two horizontal cross-sectional shapes. For example, the substrate stage 112 has a horizontal cross-sectional shape of a 6 cm×6 cm square; the first evaporator unit 120 has a horizontal cross-sectional shape of a circle with a 6 cm diameter; and the center of the square and the center of the circle are vertically aligned. In another example, each of the substrate stage 112 and the first evaporator unit 120 has a horizontal cross-sectional shape of a circle with a 10 cm diameter; and the centers of these two circles are vertically aligned. Therefore, the deposition of the $BX_2$ vapor is substantially directional, following the line-of-sight transfer and yet covering a large horizontal cross-sectional area. On the other hand, the deposition of the AX vapor is substantially less directional since the AX vapor is controlled to stay circulating and filing the chamber. The $BX_2$ vapor hits the substrate surface 116 and is deposited thereon effectively based partially on the good sticking coefficient and wettability of the $BX_2$ material. Thereafter, the chemical reaction takes place between the deposited $BX_2$ and the AX vapor existent in the proximity of the substrate surface 116. That is, according to the present system and method, the perovskite film is formed by the chemical reaction between the $BX_2$ molecules deposited on the substrate 116 and the AX molecules in the gas phase. Thus, the present system and method allow for uniform chemical reaction on a large area of the substrate surface 116, resulting in a large-scale and substantially uniform perovskite film with high crystallinity even without annealing. Here, the large-scale fabrication refers to the formation of perovskite films with centimeter-scale uniformity or even larger. Scaling-up of the fabrication is possible by keeping the line-of-sight transfer of the $BX_2$ deposition and the AX vapor circulation in the chamber, and by simultaneous enlargement of both the horizontal cross-sectional areas of the first evaporator unit 120 and the substrate stage 112. Efficient chemical reaction on the substrate surface 116 can be promoted, and thus the speed of the film growth can be made significantly fast by optimizing the evaporation rates of both source materials via the respective temperature controls, the circulation of the AX vapor flow, hence the AX incorporation ratio to the deposited $BX_2$, via the flow control, and the internal pressure via the gate valve positioning, among various parameters. Thus, the present system and method are configured to utilize the good sticking coefficient and wettability of the $BX_2$ material and the volatility of the AX material. The resultant film thickness is primarily controlled by the movement of the first shutter 136 to cover or expose the substrate 116.

Therefore, the present fabrication process is inherently different from a typical physical vapor co-deposition process. In a typical physical vapor co-deposition process, two evaporators need to be situated side-by-side with an angle so that both vapor flows are directed at the substrate surface to have line-of-sight transfer of both source materials. Accordingly, each of the vapor flows reaches the substrate surface at an angle, limiting the overlap region of the two vapor flows. That is, in a conventional physical vapor co-deposition process, the composition ratio of the resultant perovskite film in the central region is different from that in the edge region of the film. Therefore, the substrate size is limited, and the crystallinity of the resultant perovskite film tends to be of low quality even after annealing because of non-uniform composition of the two source materials (i.e., $BX_2$ and AX). Furthermore, the present system for the hybrid deposition process includes the first evaporator unit 120 that has a large horizontal cross-sectional area for evaporating the $BX_2$ source, whereas in a conventional physical vapor co-deposition system it is not possible to configure one of the evaporators to have a wider opening than the other because the evaporators will mechanically interfere with each other due to the side-by-side positioning of the two evaporators with an angle. For example, the monitor for the AX vapor will be influenced by the $BX_2$ evaporation, which violates the operation principle of the typical physical vapor co-deposition process. Yet furthermore, the present system includes the flow control unit 128 to generate substantially uniform flow of the AX vapor over the substrate surface 116, thereby optimizing the AX incorporation ratio to the deposited $BX_2$, whereas a flow control unit does not lead to benefits for physical vapor co-deposition because it is irrelevant to the operation principles based on a purely physical process in the molecular regime. Additionally, in a commercially available physical vapor deposition system, the temperature range of the substrate stage is limited from −10° C. to 80° C., whereas the present system can be configured to have a wider temperature range from −190° C. up to 200° C.

Additional steps may be included in the fabrication process to further improve the stoichiometry of perovskite films grown based on the present system and method. For example, it may be beneficial to include steps for suppressing the generation of AX-rich region in the film. Specifically, during the warmup of the second evaporator unit 124/724 for generating the AX vapor until a predetermined evaporation rate is attained, deposition of the AX molecules on the substrate 116/716 can occur. Although the first shutter 136/736 is initially closed to cover the substrate 116/716 until the nominal deposition is started as illustrated in the flowchart of FIG. 9, the AX vapor may swiftly move around the first shutter 136/736 to reach the substrate surface 116/716 due to the volatility of the AX material. Furthermore, the generation of the AX vapor cannot be ceased immediately when the heating of the second evaporator unit 124/724 is stopped at step 940 in the process in FIG. 9. This is because it generally takes a substantial period of time for the container containing the AX powder in the second evaporator unit 124/724 to cool down. As a result, the unknown concentration of the AX vapor in the chamber may generate a perovskite film with topmost layers having the AX-rich composition ratio causing non-uniformity of the film.

One way to circumvent the problem associated with the volatility of the AX material, especially during the ramp-up and ramp-down of the evaporation temperature, is to use a second housing, commonly known as a load-lock chamber. FIGS. 11A-11D illustrate a sequence of system configurations including a load-lock chamber for reducing the effect arising from the volatility of the AX material that may cause non-uniformity of a perovskite film. FIG. 11A illustrates a system configuration including a first housing 1100 that serves as a main vacuum chamber, coupled with a second housing 1160 that serves as a load-lock chamber on one side and with a sample transfer system 1180 on the other side, wherein the second housing 1160 and the sample transfer system 1180 are provided facing opposite to each other. The first housing 1100 serves as a main vacuum chamber for the deposition, similar to the housing 100 in FIG. 1 or the housing 700 in FIG. 7. The parts coupled to the first housing 1100 are similar to those parts explained earlier with reference to FIG. 1 or 7, or adapted in accordance with the present purpose while keeping the key functionalities as modified or designed by those skilled in the art. That is, a first pump unit 1104, a first gate valve 1108, a substrate stage 1112, a first evaporator unit 1120, a first shutter 1136 and the other parts (omitted in the figure for simplicity) in FIG. 11A are configured similarly to or adapted correspondingly to the pump unit 104/704, the gate valve 108/708, the substrate stage 112/712, the first evaporator unit 120/720, the first shutter 136/736 and the other parts in FIG. 1/7, respectively. The second housing 1160, which serves as a load-lock chamber, is coupled to a second pump unit 1164 through a second gate valve 1168, which are configured to control the pressure inside the second housing 1160. The second housing 1160 is further coupled to the first housing 1100 through a third gate valve 1172, which is configured to control the communication between the second housing 1160 and the first housing 1100. The sample transfer system 1180 includes a mechanical device 1184, such as a grab having hinged jaws, for holding and releasing an object. Another example of the mechanical device 1184 is a magnetically controlled unit for holding and releasing a metal object. The mechanical device 1184 is attached at one end portion of a rod 1185 in the sample transfer system 1180, and is provided inside the first housing 1100. The movement of the mechanical device 1184 is controlled by the movement of the rod 1185, which is controlled manually, by a computer or other suitable means. In FIGS. 11B-11D, the reference numerals are omitted; however, the housings, the coupled parts and respective functionalities are the same as those described above with reference to FIG. 11A.

Initially, as illustrated in FIG. 11A, a substrate 1116 is stored in the second housing 1160, and the second pump unit 1164 and the second gate valve 1168 are controlled to attain a predetermined pressure level in the second housing 1160 while the third gate valve 1172 is closed. Thereafter, the deposition can be started in the first housing 1100, following the steps 904-924 in the process illustrated in FIG. 9, for example. After controlling the evaporation temperatures to reach desired evaporation rates of the source materials in step 920 and controlling the flow control unit to circulate the AX vapor in the first housing 1100 in step 924, the third gate valve 1172 is opened, and the mechanical device 1184 in the sample transfer system 1180 is moved to reach out and hold the substrate 1116 in the second housing 1160, as illustrated in FIG. 11B. Thereafter, the mechanical device 1184 holding the substrate 1116 is controlled to move back to the first housing 1100 and release and place the substrate 1116 on the substrate stage 1112 facing downward, as illustrated in FIG. 11C. Thereafter, the third gate valve 1172 is closed, and the mechanical device 1184 is moved back to the original position, as illustrated in FIG. 11D. Thereafter, the first shutter 1136 is moved to expose the substrate 1116 on the substrate stage 1112, as in step 928 of the process in FIG. 9, and the deposition is started.

The reversed sequence of the system configurations, i.e., FIGS. 11D, 11C, 11B and 11A in order, can be carried out after the completion of the deposition to reduce the excess deposition of the AX molecules on top of the grown film. For example, the reversed sequence to transfer the substrate 1116 with the grown film from the first housing 1100 to the second housing 1160 can be carried out after the heating of the first evaporator unit 1120 and the second evaporator unit (omitted in the figure for simplicity) is stopped in step 940, and the first gate valve 1108 is opened to a second position, which can be a completely open position, in step 944 to pump out the remaining vapor from the first housing 1100. That is, the third gate valve 1172 is opened, and the mechanical device 1184 is moved to reach out and hold the substrate 1116 on which the perovskite film is grown in the housing 1100, moved to the second housing 1160 to release and place the substrate 1116 on which the perovskite film is grown in the second housing 1160, and moved back to the housing 1100; and thereafter the third gate valve 1172 is closed. The above sequence can carried out after the first gate valve 1108 is opened to pump out the remaining vapor in step 944 so as to avoid contaminating the load-lock chamber with the volatile AX material.

FIG. 12 is a flowchart illustrating the fabrication method of a perovskite film using the present system including a load-lock chamber. Sub-processes based on the use of the load-lock chamber are added to the fabrication process illustrated in FIG. 9 to improve the uniformity of the film by reducing the AX-rich regions in the film, which may be caused by the excess deposition of the AX molecules during, for example, the ramp-up and ramp-down of the evaporation temperature. The first sub-process 1200 for transferring the substrate 1116 from the second housing 1160, i.e., the load-lock chamber, to the first housing 1100, i.e., the main chamber, is described above with reference to the sequence of the system configurations illustrated in FIGS. 11A, 11B, 11C and 11D in order. This first sub-process may be carried out after step 924 and before step 928 in the process illustrated in FIG. 9. The second sub-process 1204 for transferring the substrate 1116 with the grown film from the first housing 1100, i.e., the main chamber, to the second housing 1160, i.e., the load-lock chamber, is described above with reference to the reverse sequence of the system configurations illustrated in FIGS. 11D, 11C, 11B and 11A in order. This second sub-process may be carried out after step 944 in the process illustrated in FIG. 9.

The following describes some of the experimental results obtained by using the present system and method for growing perovskite films. Examples of using MAI for the AX source material and $PbCl_2$ for the $BX_2$ source material are given hereinafter, for growing chloride iodide perovskite films $CH_3NH_3PbI_{3-X}Cl_X$ based on the system illustrated in FIG. 1, wherein a dish-shaped crucible with a heating element, as illustrated in FIG. 5A-5C, is used for the first evaporator unit 120 and a cell evaporator coupled to the side section of the housing 100, as illustrated in FIG. 4A, is used for the second evaporator unit 124. The first and second sub-processes by using a load-lock chamber, as steps 1200 and 1204 in FIG. 12, are included in the fabrication process for the present examples. The substrate stage 112 is configured to accommodate a large substrate 116 having dimensions of 5 cm×5 cm. The following results pertain to the perovskite films grown to thicknesses of ~50 nm and ~135 nm.

FIG. 13 is a plot of the J-V curve representing the photovoltaic device characterization of a solar cell including the chloride iodide perovskite film, $CH_3NH_3PbI_{3-X}Cl_X$, grown by the present fabrication system and method. The results for the film with a thickness of ~50 nm and the film with a thickness of ~135 nm are plotted with lines including squares and circles, respectively. The measurements to obtain the J-V curves were carried out under a simulated AM1.5G solar irradiation of 100 mW/cm$^2$. The J-V curve for the ~50 nm film shows that the short circuit current density (Jsc) is 10.5 mA/cm$^2$, the open circuit voltage (Voc) is 1.06 V, and the fill factor (FF) is 0.566. This sample has the power conversion efficiency (PCE) of about 6.3%. The J-V curve for the ~135 nm film shows that the short circuit current density (Jsc) is 17 mA/cm$^2$, the open circuit voltage (Voc) is 1.09 V, and the fill factor (FF) is 0.535. This sample has the power conversion efficiency (PCE) of about 9.9%. All six solar cells from the same batch of each film exhibited the similar J-V performance, thereby indicating the device yield of 100%.

FIG. 14 is a plot showing the X-ray diffraction (XRD) spectrum of the $CH_3NH_3PbI_{3-X}Cl_X$ film with a thickness of ~50 nm. This XRD spectrum shows the organometal halide perovskite characteristics having peaks at 14.0°, 28.4° and 43.1° corresponding to the (110), (220) and (330) planes of the orthorhombic structure. It should be noted that the peak (110) is stronger than the (220) peak even without annealing in the present fabrication process. In general, the $CH_3NH_3PbI_3$ phase formation is indicated by a peak at 15.7° in the XRD spectrum; however, this peak is absent in the present spectrum in FIG. 14. The absence of the peak at 15.7° and the detection of the (330) peak together indicate the high phase-purity and crystallinity of the $CH_3NH_3PbI_{3-X}Cl_X$ film grown by the present system and method. Further studies based on XRD measurements indicated that the phase purity is optimal in the perovskite films fabricated with the substrate temperature being at room temperature (in the range of 15° C.-25° C.). The changes in crystal morphology as a function of substrate temperature may be ascribed to the temperature dependence of the sticking coefficient of MAI on the substrate. The sticking coefficient is generally defined as the fraction of the incident molecules from the source that actually adhere to the substrate. MAI has chemical properties that make its sticking coefficient high at low temperatures and low at high temperatures. Thus, at low temperatures, e.g., lower than −20° C., the MAI sticking coefficient is high but partial coverage of the perovskite on the substrate is likely to occur. At high temperatures, e.g., higher than 80° C., it is difficult to form a perovskite film with suitable stoichiometry because of the small sticking coefficient of MAI and the excess amount of $PbCl_2$.

FIG. 15 is a plot showing the X-ray diffraction (XRD) spectra of the $CH_3NH_3PbI_{3-X}Cl_X$ film of ~135 nm thickness grown on a tin-doped indium oxide (ITO)/glass substrate with a 5 cm×5 cm surface area. The inset illustrates 12 different locations over the sample selected for the XRD measurements. This plot shows that the XRD spectra at the 12 different locations have similar intensities of the diffraction peaks, indicating the organometal halide perovskite characteristics, at 14.0°, 28.4° and 43.1° corresponding to the (110), (220) and (330) planes of the orthorhombic structure. The results confirm that uniformity and high crystallinity of the perovskite films are attained over the large substrate by using the present system and method.

FIG. 16 is a photo showing the atomic force microscopy (AFM) image of the $CH_3NH_3PbI_{3-X}Cl_X$ film of ~50 nm thickness grown on the ITO/glass substrate. The AFM image shows that the typical root-mean square (RMS) roughness of the film of ~50 nm thickness is about 4.6 nm. Similarly, the typical RMS roughness of the film of ~135 nm was measured to be about 9 nm.

FIG. 17 is a plot showing the optical absorption of the $CH_3NH_3PbI_{3-X}Cl_X$ film of ~135 nm thickness. A sharp rise at ~780 nm corresponds to a bandgap of 1.59 eV.

FIG. 18 shows photos of actual devices including the $CH_3NH_3PbI_{3-X}Cl_X$ films of ~50 nm thickness and ~135 nm thickness, respectively. The color is semi-transparent light-orange in both cases.

While this document contains many specifics, these should not be construed as limitations on the scope of an invention or of what may be claimed, but rather as descriptions of features specific to particular embodiments of the invention. Certain features that are described in this document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be exercised from the combination, and the claimed combination may be directed to a subcombination or a variation of a subcombination.

The invention claimed is:

1. A method for fabricating a perovskite film for solar cell applications, by
    using source materials AX and $BX_2$, wherein the AX is an organic material and the $BX_2$ is a metal halide material, wherein the halogen X in the AX and the halogen X in the $BX_2$ are the same element or different elements, and by using a system comprising:
    a housing for use as a vacuum chamber, the housing having a side section along a vertical direction and top and bottom sections along a horizontal direction;
    a substrate stage coupled to the top section of the housing and configured to have a stage surface facing vertically downward for a substrate to be placed on;
    a first evaporator unit coupled to the bottom section of the housing and configured to generate $BX_2$ vapor, the first evaporator unit comprising a crucible and a heater element contacting the crucible;
    a second evaporator unit coupled to the housing and configured to generate AX vapor;
    a flow control unit coupled to the housing for controlling circulation of the AX vapor in the housing, the flow control unit selected from the group consisting of a fan, foreline pump and a combination thereof;
    a gate valve coupled between the housing and a pump unit for controlling pressure inside the housing;
    a first shutter provided below the substrate stage and configured to be moved to expose or cover the substrate stage; and
    a second shutter provided above the first evaporator unit and configured to be moved to expose or cover the first evaporator unit, the method comprising:
    controlling temperature of the substrate stage for providing uniform cooling or heating to the substrate;
    moving the first shutter to cover the substrate;
    moving the second shutter to expose the first evaporator unit;
    opening the gate valve to a first position;
    controlling a first evaporation temperature associated with the first evaporator unit to adjust a first evaporation rate for generating the $BX_2$ vapor;
    controlling a second evaporation temperature associated with the second evaporator unit to adjust a second evaporation rate for generating the AX vapor, the second evaporation temperature being lower than the first evaporation temperature;
    controlling the flow control unit to control the circulation of the AX vapor;
    moving the first shutter to expose the substrate;
    monitoring thickness of the perovskite film growing on the substrate;
    moving the first shutter to cover the substrate when the thickness of the perovskite film reaches a predetermined thickness;
    terminating heating of the first and second evaporator units; and
    opening the gate valve to a second position to pump out remaining vapor inside the housing,
    wherein a center of the substrate stage and a center of the first evaporator unit are vertically aligned, and
    wherein dimensions of a horizontal cross-sectional shape of the first evaporator unit, dimensions of a horizontal cross-sectional shape of the substrate stage, and a relative position in the horizontal direction between the two horizontal cross-sectional shapes are configured to maximize an overlap between the two horizontal cross-sectional shapes.

2. The method of claim 1, wherein the substrate stage, the first evaporator unit, the second evaporator unit and the flow control unit are configured to enable deposition of the $BX_2$ vapor to be substantially directional, following line-of-sight transfer from the first evaporator unit to the substrate, while enabling deposition of the AX to be less directional based on the AX vapor circulating in the housing.

3. The method of claim 1, wherein the stage surface of the substrate stage is configured to have an area for accommodating a substrate having a size of 5 cm×5 cm or larger, wherein the substrate is a one-piece substrate or a collection of a plurality of substrates.

4. The method of claim 1, wherein the controlling the temperature of the substrate stage comprises controlling the temperature of the substrate stage to have the substrate at a room temperature in a range between 15° C. to 25° C.

5. The method of claim 1, further comprising placing the substrate on the substrate stage prior to the controlling the temperature of the substrate stage.

6. The method of claim 1, wherein the system further comprises:
    a second housing for use as a load-lock chamber;
    a second gate valve coupled between a second pump unit and the second housing, the second gate valve and the second pump being configured for controlling pressure inside the second housing;
    a third gate valve coupled between the housing and the second housing for controlling communication therebetween; and
    a sample transfer system coupled to the housing for transferring the substrate between the housing and the second housing, the method further comprising:
    storing the substrate in the second housing;
    controlling the second pump unit and the second gate valve to have a predetermined pressure level in the second housing while the third gate valve is closed;
    opening the third gate valve;
    controlling the sample transfer system to reach and hold the substrate in the second housing and transfer the substrate from the second housing to the housing, and to release and place the substrate on the substrate stage; and
    closing the third gate valve,
    wherein
    the opening through the closing the third gate valve are carried out after the controlling the flow control unit to control the circulation of the AX vapor and prior to the moving the first shutter to expose the substrate.

7. The method of claim 6, further comprising:
    opening the third gate valve;
    controlling the sample transfer system to reach and hold the substrate on which the perovskite film is grown in the housing and transfer the substrate on which the perovskite film is grown from the housing to the second housing, and to release and place the substrate on which the perovskite film is grown in the second housing; and closing the third gate valve, wherein the opening through the closing the third gate valve are carried out after the opening the gate valve to a second position to pump out remaining vapor inside the housing.

8. The method of claim 6, wherein the organic element A is selected from a group consisting of MA, FA and 5-AVA.

\* \* \* \* \*